United States Patent [19]

Yamashita

[11] 4,264,976
[45] Apr. 28, 1981

[54] TUNING CONTROL APPARATUS FOR DIGITAL TUNER

[75] Inventor: Norio Yamashita, Gunma, Japan

[73] Assignees: Sanyo Electric Co., Ltd., Osaka; Tokyo Sanyo Electric Co., Ltd., Gunma, both of Japan

[21] Appl. No.: 18,046

[22] Filed: Mar. 6, 1979

[30] Foreign Application Priority Data

| Mar. 17, 1978 | [JP] | Japan | 53-32219 |
| Mar. 17, 1978 | [JP] | Japan | 53-32220 |
| Sep. 29, 1978 | [JP] | Japan | 53-121880 |
| Sep. 29, 1978 | [JP] | Japan | 53-121881 |

[51] Int. Cl.$^3$ .............................................. H04B 1/34
[52] U.S. Cl. ................................. 455/161; 455/150; 455/179; 334/15
[58] Field of Search ............... 325/419, 420, 421, 422, 325/423, 452, 453, 457, 459, 464, 465, 468, 469, 470; 358/191, 193, 195; 334/11, 15, 16; 455/161, 173, 182, 192, 196, 258, 150, 179, 260, 261

[56] References Cited

U.S. PATENT DOCUMENTS

| 3,968,440 | 7/1976 | Ehni | 325/464 |
| 4,053,838 | 10/1977 | Amaya | 325/470 |
| 4,079,420 | 3/1978 | Mogi et al. | 325/464 |
| 4,085,371 | 4/1978 | Mogi et al. | 325/468 |
| 4,085,372 | 4/1978 | Mogi et al. | 325/464 |

OTHER PUBLICATIONS

Low-Cost Digital Tuning System with Full-Function Automatic Search Preset, T. Fjukmura, et al., IEEE Transactions on Consumer Electronics, vol. CE-24, No. 4, Nov. 1978.

*Primary Examiner*—Robert L. Griffin
*Assistant Examiner*—Tommy P. Chin
*Attorney, Agent, or Firm*—Darby & Darby

[57] ABSTRACT

A tuning control apparatus for a digital automatic scanning tuner or a digital preset tuner employing a voltage controlled variable capacitance diode as a tuning element, wherein a tuning state detecting circuit is provided for detecting a tuning state responsive to a first signal which assumes the high level when the actual tuning frequency of the tuner falls in a predetermined tuning frequency range which is higher than the correct tuning frequency being received and a second signal which assumes the high level when the actual tuning frequency of the tuner falls in a predetermined frequency range which is lower than the correct tuning frequency being received, and when the tuner is to be tuned to the frequency of a given broadcasting signal a tuning voltage being applied to the voltage controlled variable capacitance diode is varied in the upward or the downward direction, whereby the lower end of the second signal or the upper end of the first signal is detected, whereupon the lower end of the first signal or the upper end of the second signal is detected, when the tuning voltage is changed in the reversed direction, whereupon the upper end of the second signal or the lower end of the first signal is detected, just when the tuning voltage is determined as achieving a tuning operation by the tuner to the correct tuning frequency.

27 Claims, 32 Drawing Figures

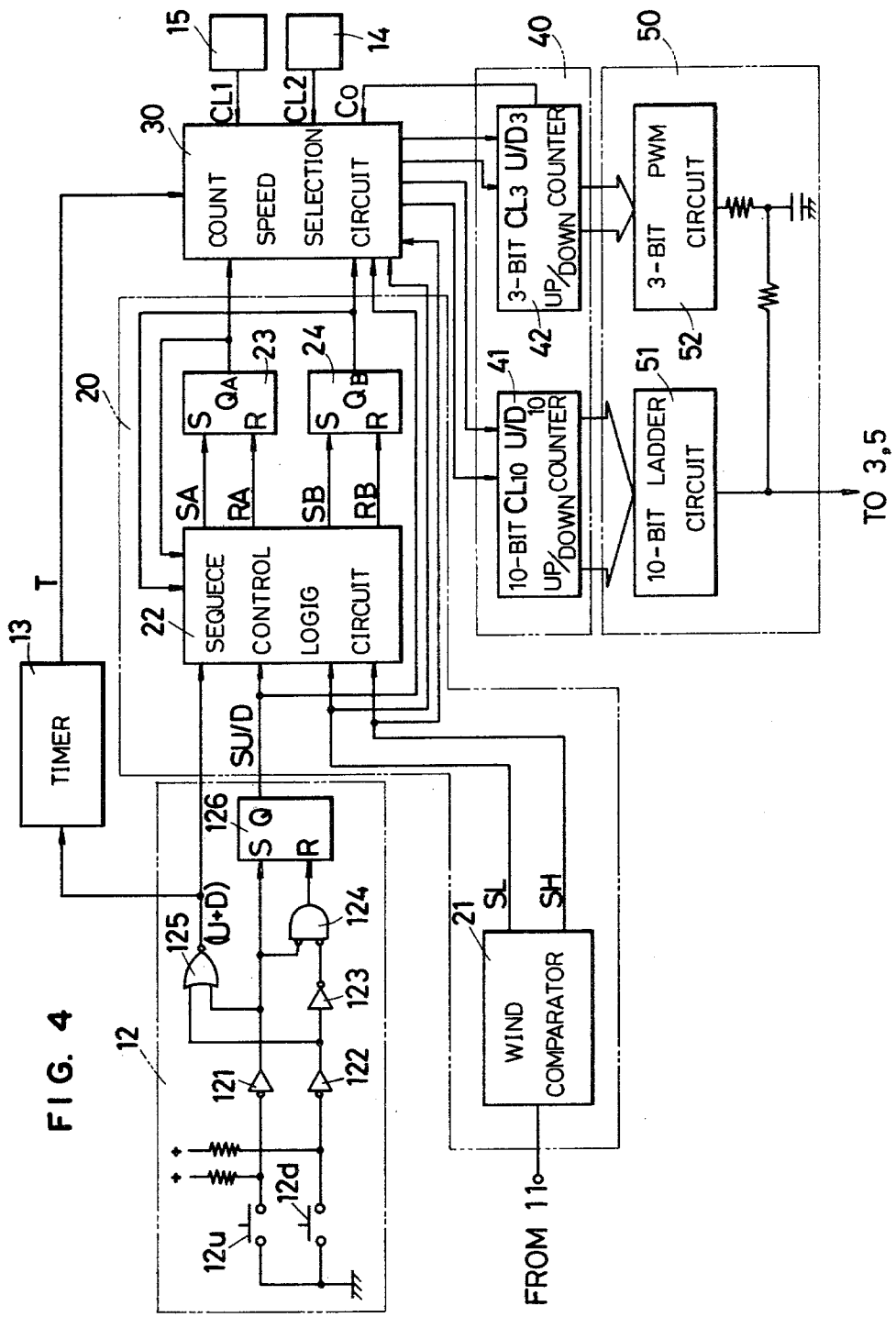

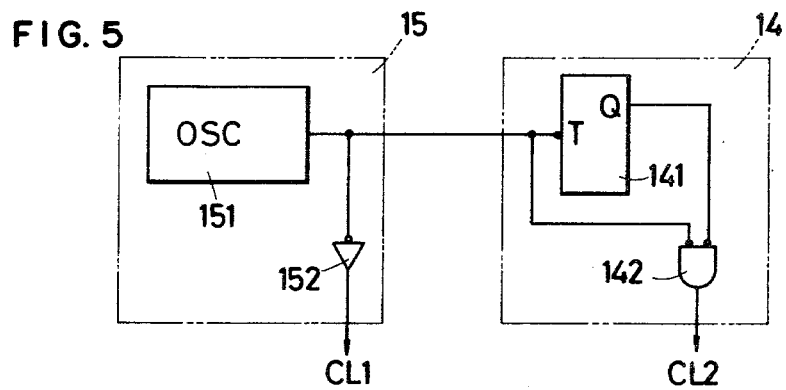
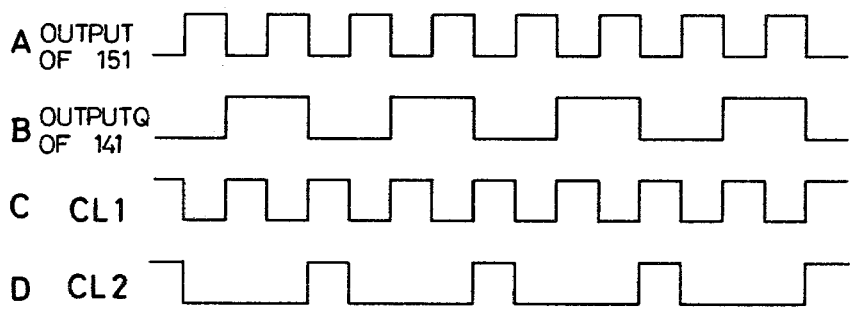
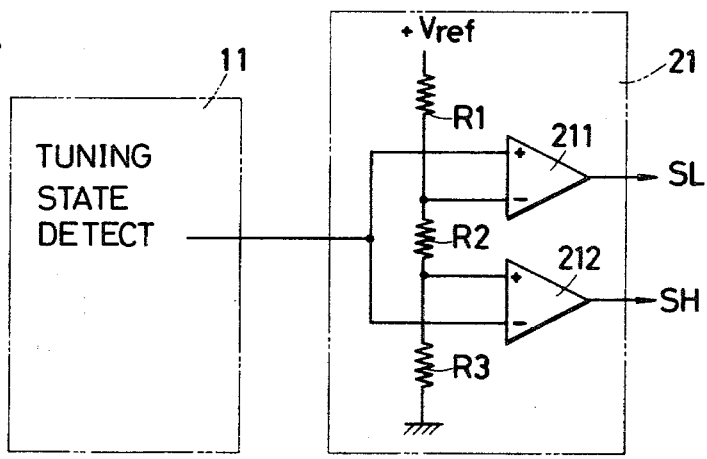

FIG. II
COUNT SPEED SELECTION CIRCUIT

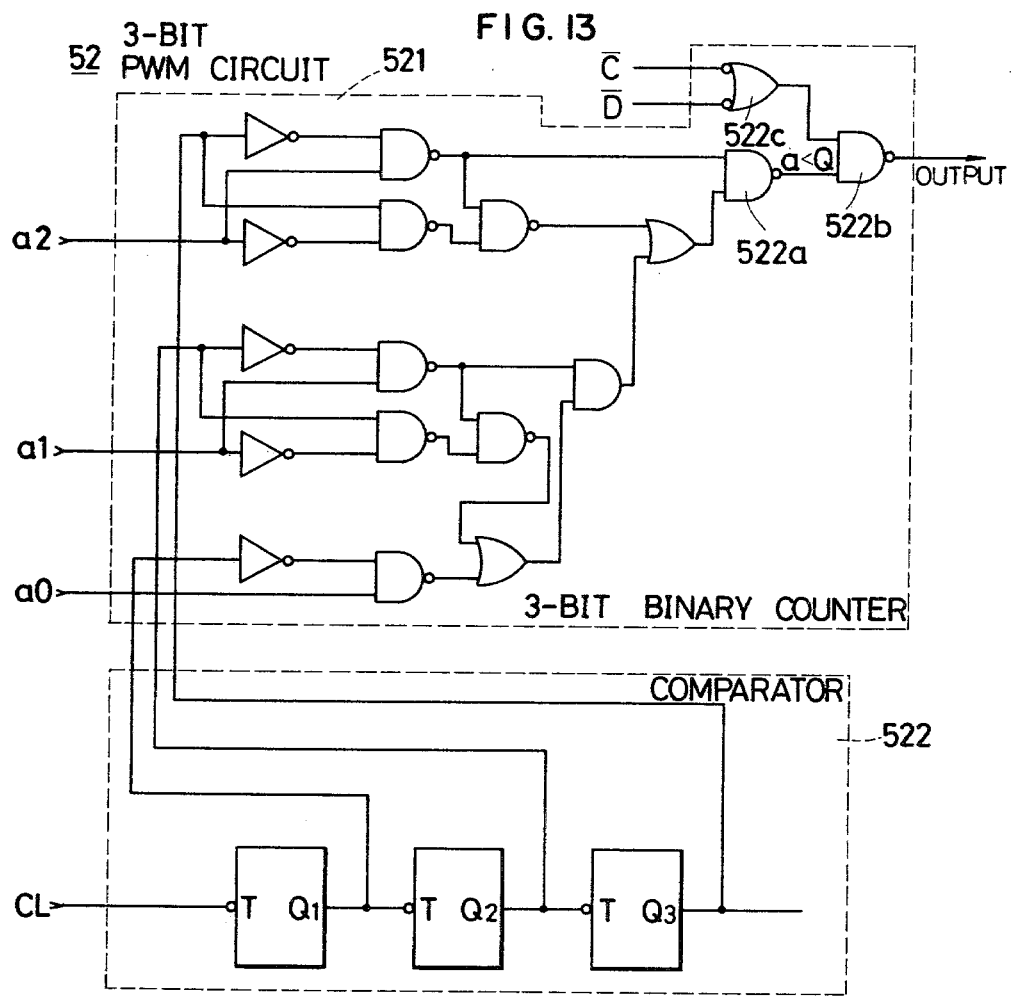

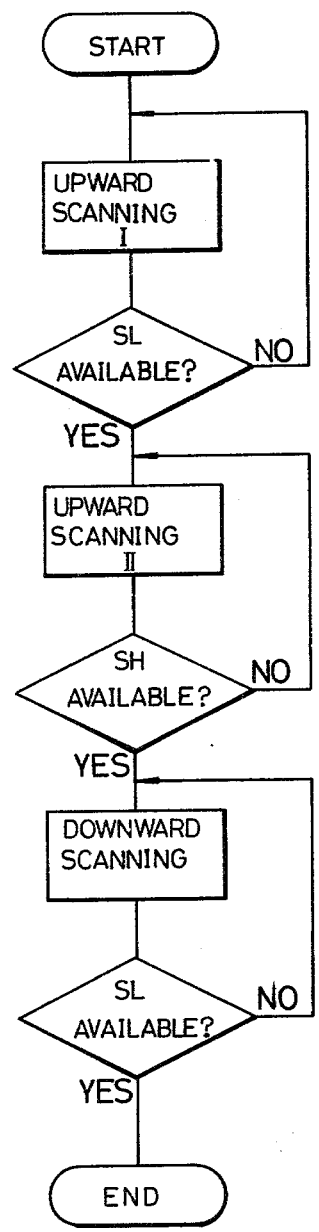
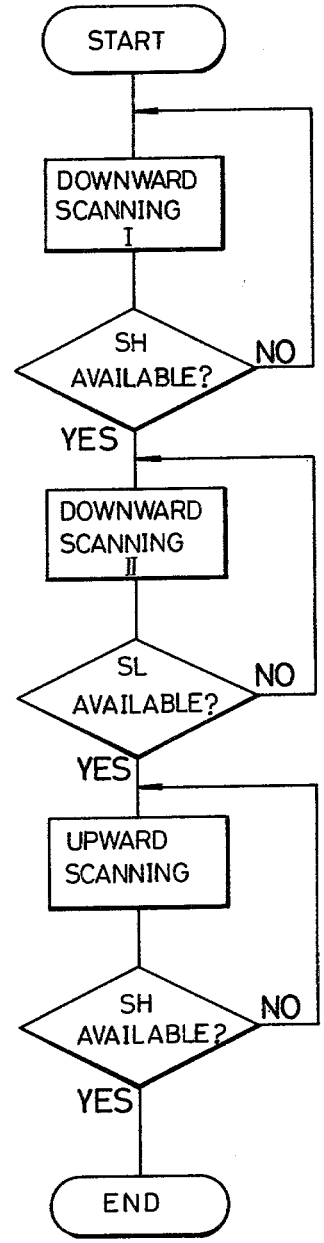

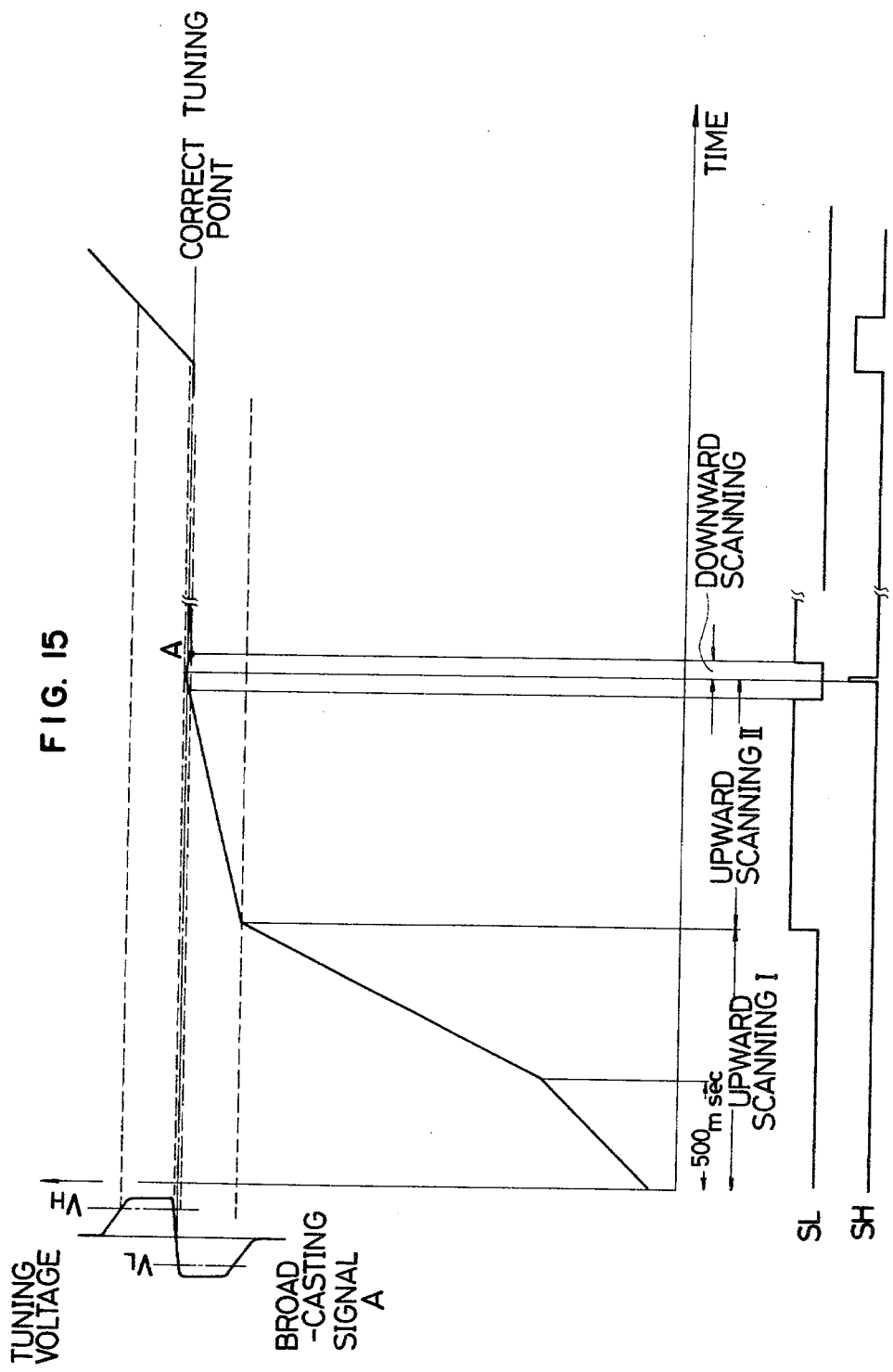

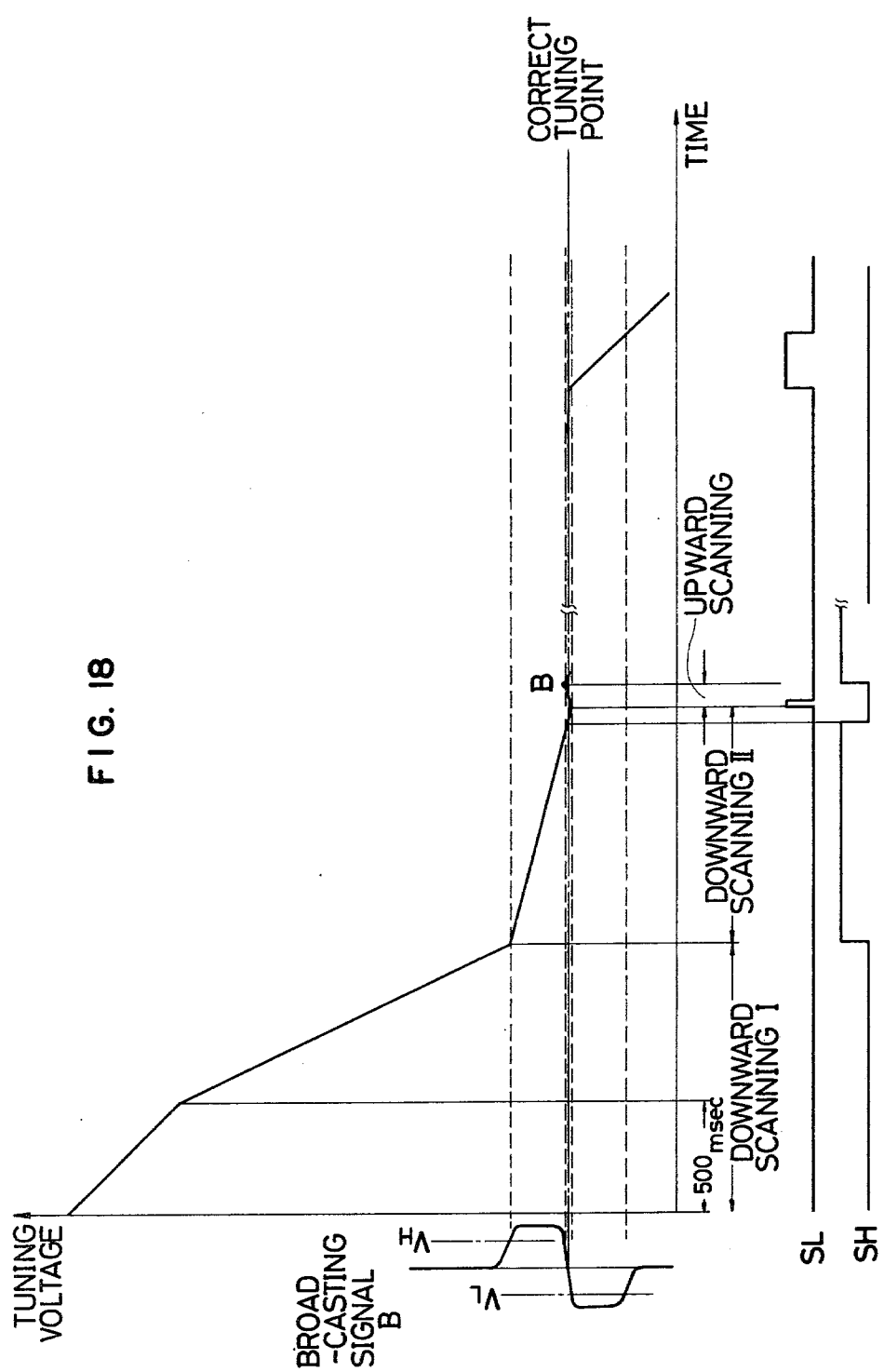

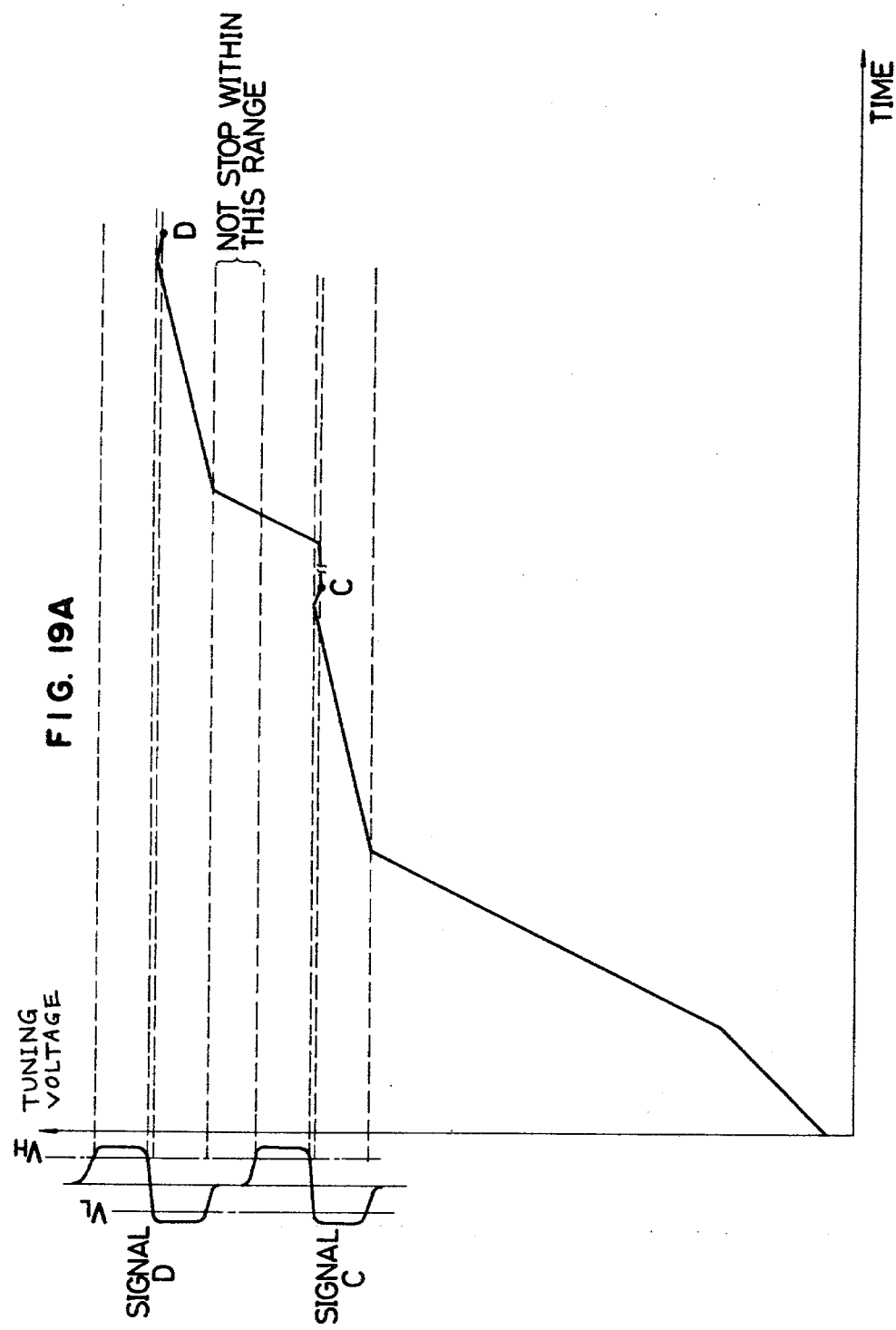

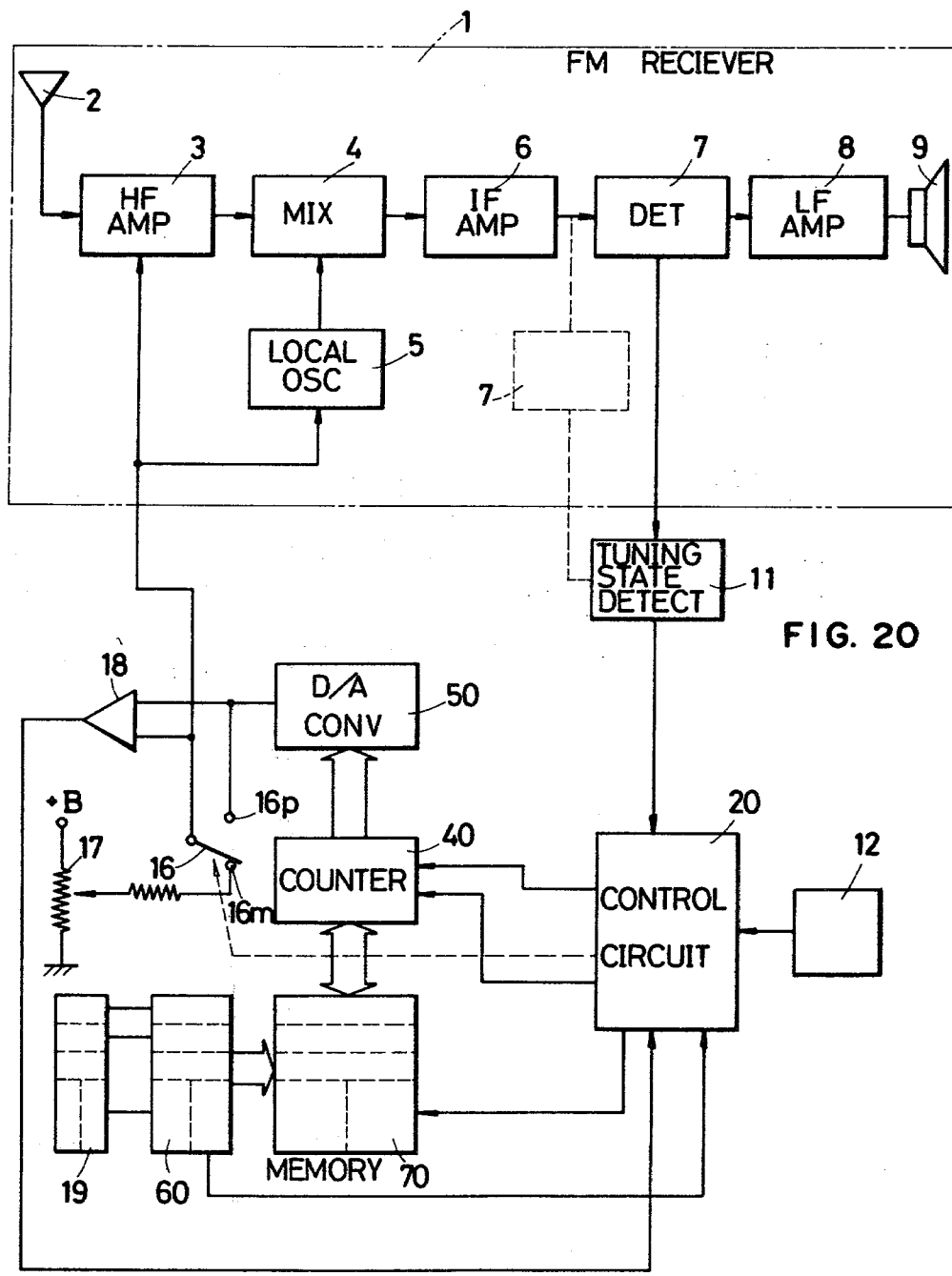

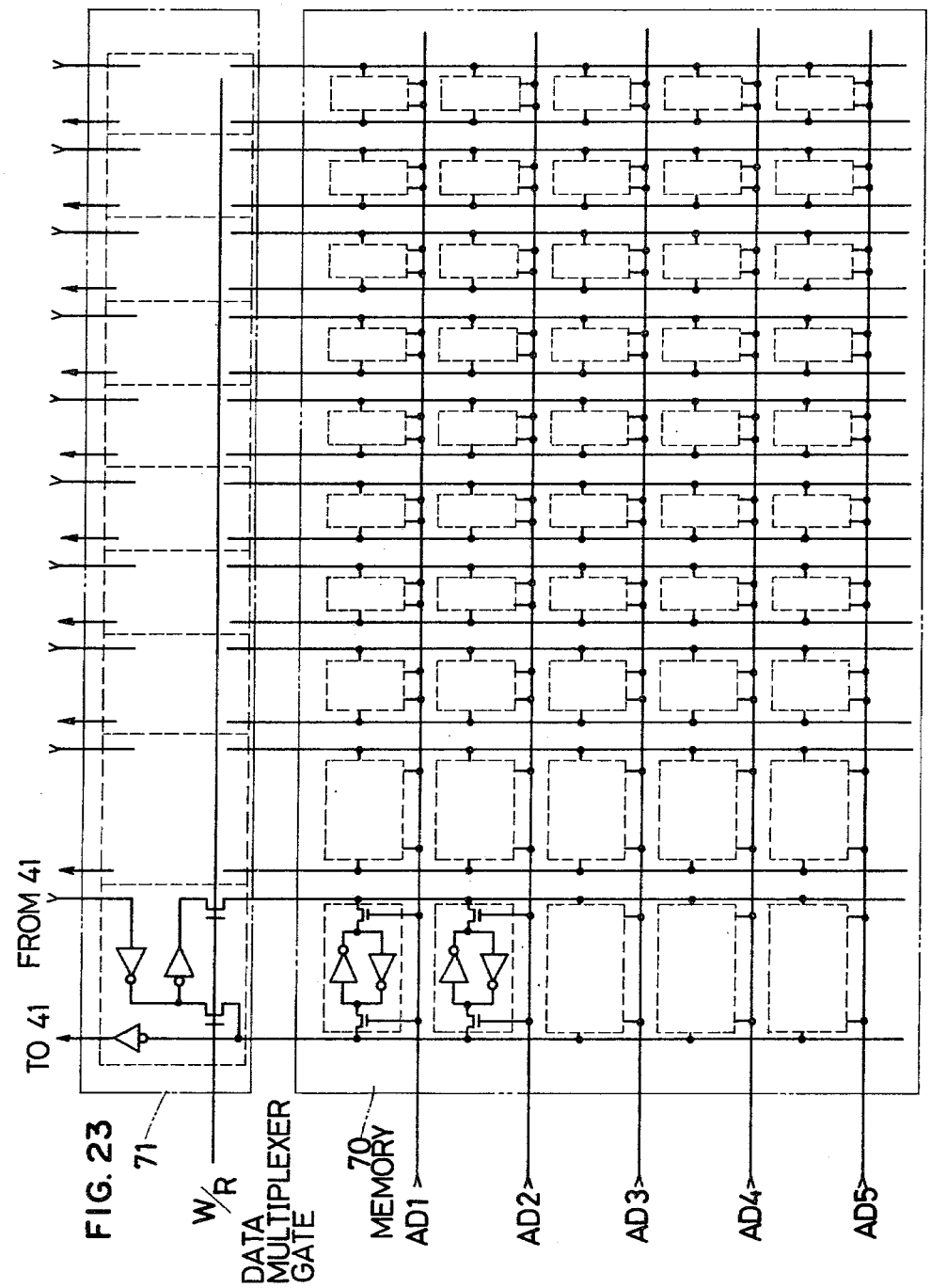

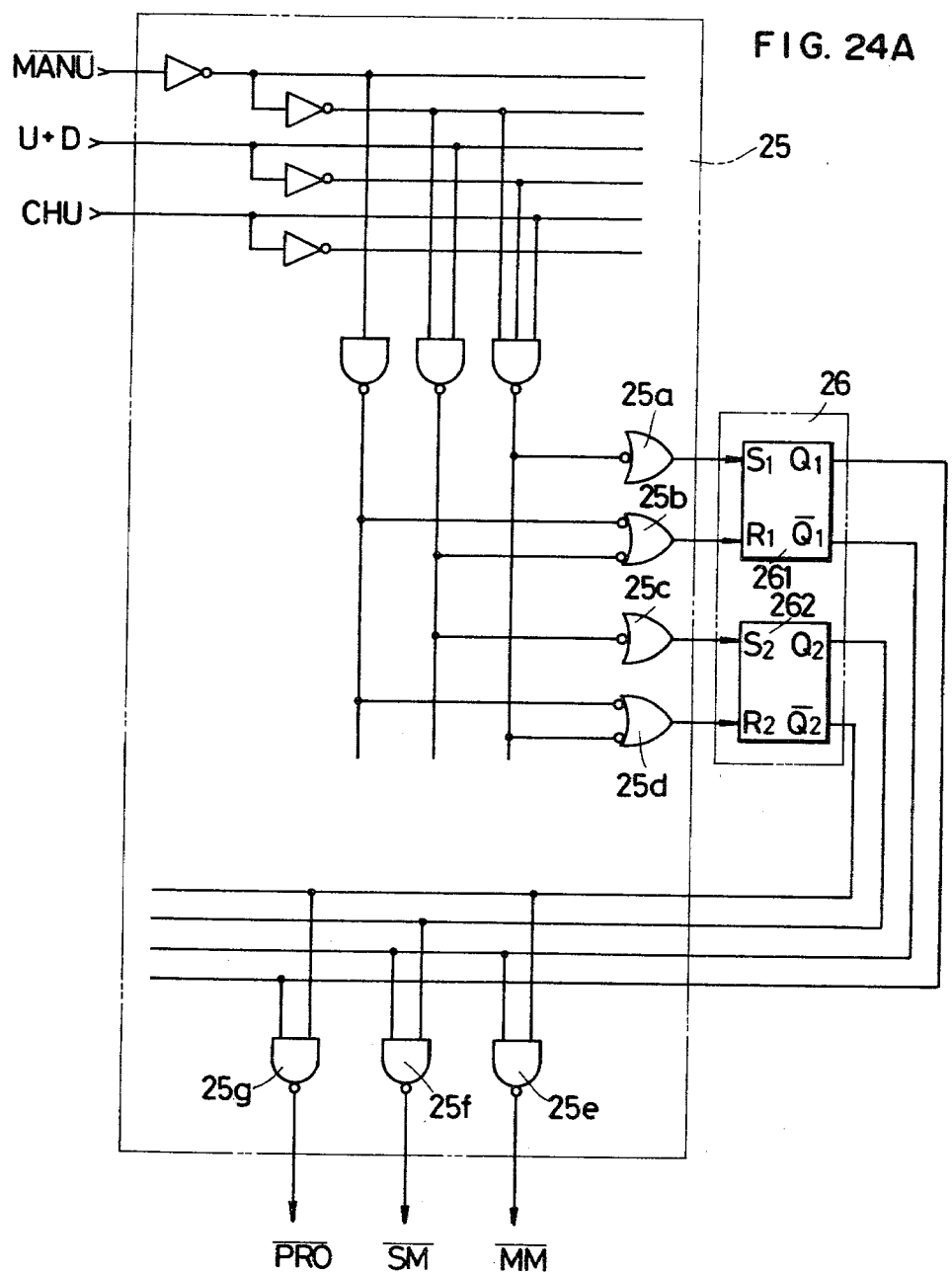

TUNING CONTROL APPARATUS FOR DIGITAL TUNER

BACKGROUND OF THE INVENTION

1. Field of the Invention;

The present invention relates to a tuning control apparatus for a digital tuner. More specifically, the present invention relates to a control apparatus for determining a tuning voltage being applied to a voltage controlled reactance device as a tuning element employed in a digital automatic scanning tuner or a digital preset tuner.

2. Description of the Prior Art;

With the latest developments of large scale integration circuit technology and in view of a recent trend of a digital display of the frequency of a broadcasting signal received by radio receivers, so-called digital tuners have been widely used. Such digital tuners may be classified as an automatic scanning tuner, as disclosed in U.S. Pat. No. 4,085,371, for example, and a preset tuner, as disclosed in U.S. Pat. No. 3,968,440. Taking an example of such automatic scanning tuners upon depression of an upward scanning switch or a downward scanning switch, an automatic scanning operation is initiated, which is achieved by an up/down counter adapted to be stepped responsive to clock pulses, a sequential change of the count value in the counter being converted into an analog voltage, which is applied as a tuning voltage to a voltage controlled variable capacitance diode employed as a tuning element in the tuner. The scanning operation is terminated when the tuner is tuned to the frequency of a broadcasting signal being recieved and the same is detected, whereupon the tuning voltage is controlled such that the tuning frequency is maintained by the tuner. Taking an example of a preset tuner, a plurality of digital data signals associated with the frequencies of the broadcasting signals being selected by the tuner are in advance stored in a memory and one digital data signal corresponding to the frequency of a desired broadcasting signal is selectively read out responsive to operation of a channel selection switch, whereupon the digital data signal is converted into an analog signal, which is then applied as a tuning voltage to a voltage controlled variable capacitance diode employed as a tuning element in the tuner, thereby to achieve reception of the selected broadcasting signal or channel. It is pointed out that the present invention is associated with both the above described digital automatic scanning tuner and the digital preset tuner.

In case of the above described digital automatic scanning tuner, for example, the tuning voltage is continually changed, whereby the correct tuning point or the correct tuning state to the frequency being received by the tuner is detected. However, it could happen that a noise component, an image signal, a spurious signal and the like be detected as a signal being received. As a result, even if such a noise component, a pseudo signal or the like is detected, the automatic scanning operation is terminated in a conventional tuner. On the other hand, a conventional preset tuner also involves such problems as discussed in the following. More specifically, even if a complete tuning state had been established or a broadcasting signal of a given station had been received at the correct tuning point on the occasion of the preset mode and the digital data being stored in a memory had been correctly associated with the frequency of the said broadcasting station, it could happen that by virtue of a temperature variation of the receiver, a time dependent characteristic variation of the circuit components and the like, the digital data as stored in the memory comes not to be associated with the complete tuning point or the correct tuning point of the corresponding broadcasting station on the occasion of a reception mode. Furthermore, even if the presetting was complete and the radio receiver had the same characteristic as that on the occasion of the presetting operation, a possible change of a broadcasting wave depending on the location of reception, such as a "valley" between tall buildings, inside a tunnel, and the like, could cause an obstacle to a complete reception state.

SUMMARY OF THE INVENTION

The present invention employs a voltage controlled variable reactance device as a tuning element, which is supplied with a tuning voltage obtained by converting a digital value into an analog voltage. On the other hand, the tuning state is detected by a signal obtained based on the so-called S shaped curve characteristic from a demodulator, which signal comprises a first signal obtained when the tuning frequency falls in a predetermined frequency range which is higher than the correct tuning frequency and a second signal obtained when the tuning frequency falls in a predetermined frequency range which is lower than the correct tuning frequency. A tuning control apparatus is provided which is responsive to the signal obtained from a tuning state detecting means for reversing the variation direction of the tuning voltage when the first or second signal is detected and then the second or the first signal is detected, whereupon the first signal or the second signal is detected again, just when variation of the tuning voltage is stopped to maintain that point as the correct tuning point.

According to one embodiment of the inventive automatic scanning tuner, a scanning operation is effected to detect or catch the first signal or the second signal for the first time. On the other hand according to one embodiment of the inventive preset tuner, the tuning voltage is varied in a zigzag fashion alternately in the upward direction and downward direction such that the amplitude thereof gradually increases in order to catch the first signal or the second signal for the first time. The variation direction of the tuning voltage is reversed when the first signal or the second signal is first detected and then the second signal or the first signal is detected; however, preferably a variation of the tuning voltage should be small. In the embodiment of the inventive automatic scanning tuner, the scanning speed may be preferably varied suitably in accordance with a predetermined sequence.

Accordingly, a principal object of the present invention is to provide an improved tuning control apparatus for a digital tuner.

A further object of the present invention is to provide an improved tuning control apparatus for a digital tuner, which is immune to a noise component, a pseudo signal and the like.

A further object of the present invention is to provide a tuning control apparatus for a digital tuner, wherein a tuning operation can be achieved by the tuner accurately to the correct and complete tuning point.

Still a further object of the present invention is to provide an improved tuning control apparatus for a digital tuner, which is of a relatively simple circuit configuration.

These objects and the other objects, features, aspects and advantages of the present invention will become more apparent from the following detailed description of the present invention when taken in conjunction with the accompanying drawings.

BRIEF DESCRIPTION OF THE DRAWINGS

FIG. 4 is a block diagram showing in more detail a major portion of the FIG. 1 embodiment;

FIG. 5 is a diagram showing one example of a low repetition rate clock generator and a high repetition rate clock generator shown in FIGS. 1 and 4;

FIG. 6 shows waveforms of electrical signals at various portions in the FIG. 5 diagram;

FIG. 7 is a diagram showing one example of a wind comparator shown in FIG. 4;

FIG. 13 is a diagram showing in detail one example of a three-bit pulse width modulation circuit shown in FIG. 4;

FIG. 14 is a flow diagram showing a sequence of the scanning operation in the upward direction in accordance with the FIG. 1 embodiment;

FIG. 15 is a timing chart for explaining the scanning operation in the upward direction in accordance with the FIG. 14 flow diagram;

FIG. 16 shows a variation of the tuning voltage for explaining the downward scanning operation the resolution of which is varied in FIG. 15;

FIG. 17 is a flow diagram showing a sequence of the scanning operation in the downward direction in accordance with the FIG. 1 emdodiment;

FIG. 18 is a timing chart for explaining the scanning operation in the downward direction in accordance with the FIG. 17 flow diagram;

FIGS. 19A and 19B are timing charts for explaining the other operations of the FIG. 1 embodiment, respectively;

FIG. 20 is a block diagram showing another embodiment of the inventive digital preset tuner;

FIG. 23 is diagram showing in more detail the memory and data multiplexer gate shown in FIG. 21;

FIG. 24A, 24B and 24C are a diagram showing in more detail one example of a zigzag scanning control circuit 75 shown in FIG. 21;

DESCRIPTION OF THE PREFERRED EMBODIMENTS

Figure 1:
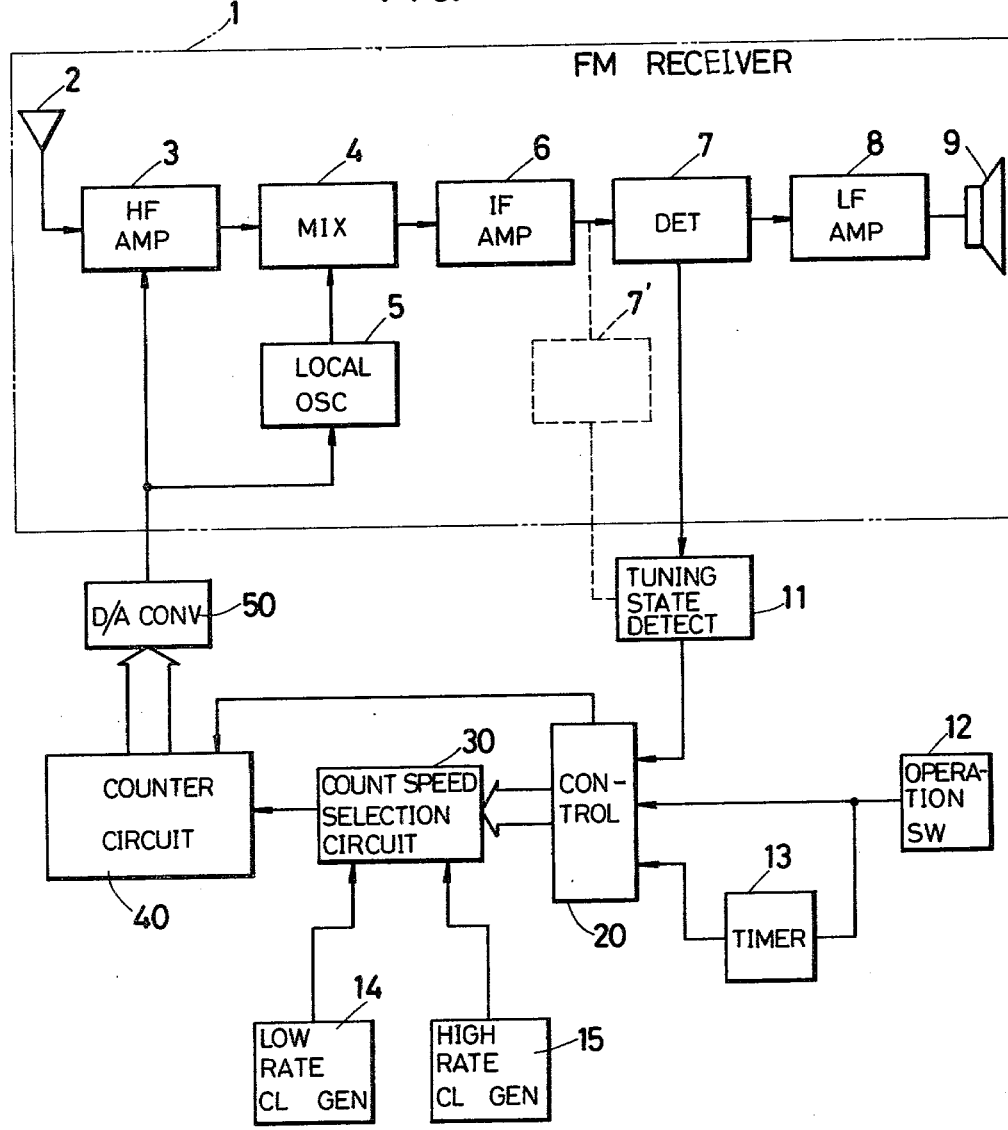
FIG. 1 is a block diagram showing one embodiment of a digital automatic scanning tuner in accordance with the present invention.

FIG. 1 is a block diagram of one embodiment of a digital automatic scanning tuner in accordance with the present invention. Referring to FIG. 1, the reference numeral 1 denotes a typical FM band radio receiver. The structure and operation of such FM radio receiver 1 has been well-known to those skilled in the art and will be described briefly in the following. A high frequency signal received by an antenna 2 is amplified by a high frequency amplifier 3 and is mixed by a mixer 4 with a local oscillation frequency signal obtained from a local oscillator 5, thereby to provide an intermediate frequency signal. To that end, the local oscillator 5 is adapted such that the same generates a local oscillation frequency signal the frequency of which is different from the frequency of the received high frequency signal by a given frequency difference commensurate with the intermediate frequency. The intermediate frequency signal is amplified by an intermediate frequency amplifier 6 and the amplified intermediate frequency signal is detected or demodulated by a detector or a demodulator 7 and the detected output is then applied to a low frequency amplifier 8. The output of the low frequency amplifier 8 is applied to a speaker 9, whereby the speaker 9 is driven in accordance with the low frequency signal and thus the information contained in the FM broadcasting signal can be heard as a sound.

Referring to FIG. 1, the reference numeral 11 denotes a tuning state detecting circuit. As more fully described subsequently with reference to FIG. 2, the tuning state detecting circuit 11 comprises an operational amplifier adapted to receive an S shaped curve signal obtainable from the demodulator or the detector 7. The output of the tuning state detecting circuit 11 is applied to a control circuit 20. If the radio receiver 1 is an AM radio receiver, then the tuning state detecting circuit 11 may be adapted to receive the output of another S shaped curve detecting circuit 7' separately provided as shown by the dotted line in FIG. 1. An operation switch 12 is also coupled to the control circuit 20, which switch 12 comprises an upward selection switch for instructing the scanning operation in the upward direction and a downward selection switch for instructing the scanning operation in the downward direction and the circuitry associated therewith, as to be more fully described subsequently with reference to FIG. 4. The signal obtained from the operation switch 12 is applied to the above described control circuit 20 and is also applied to a timer 13. The timer 13 may comprise a monostable multivibrator and is responsive to the output of the operation switch 12 to provide to the control circuit 20 a signal for controlling a count speed selection circuit 30 to render a counter circuit 40 in a low speed counting state for a predetermined time period after the output is received from the operation switch 12. The signal from the timer 13 is preferentially effective on the control circuit 20 with respect to the signal obtained from the operation switch 12. Thus, the control circuit 20 is responsive to the signals obtained from the tuning state detecting circuit 11, the operation switch 12 and the timer 13 to provide a control output to the count speed selection circuit 30 and a control signal to the counter circuit 40. Such control circuit 20 will be described in more detail with reference to FIGS. 4, 7, 8 and 9.

The count speed selection circuit 30 is selectable between a low speed mode and high speed mode and, when the low speed mode is selected, provides a low repetition frequency rate clock pulse from a low repetition frequency rate clock generator 14 to the counter circuit 40, whereas when the high speed mode is selected, provides a high repetition frequency rate clock pulse obtained from a high repetition frequency rate clock generator 15 to the counter circuit 40. The count speed selection circuit 30 will be described in more detail subsequently with reference to FIG. 11. Similarly, the low repetition frequency rate clock generator 14 and the high repetition frequency rate clock generator 15 will also be described subsequently in more detail with reference to FIGS. 5 and 6. The counter circuit 40 is responsive to a control signal obtained from the control circuit 20 and a selective clock pulse obtained from the count speed selection circuit 30 to make an up count or down count operation of the low speed or the high speed. The output of the counter circuit 40 is applied in a bit parallel fashion to a digital/analog converter 50. The digital/analog converter 50 is responsive to the count data obtained from the counter circuit 40 to generate an analog signal, which is then applied, as a tuning voltage, to voltage controlled variable reactance devices such as voltage controlled variable capacitance diodes included in the high frequency amplifier 3 and the local oscillator 5 of the FM radio receiver 1. Again the digital/analog converter 50 will be also described in more detail subsequently with reference to FIGS. 4, 12 and 13.

Now, before the operation of the embodiment shown will be described, the structure and operation of each of the blocks described above will be described individually in more detail.

Figure 2:
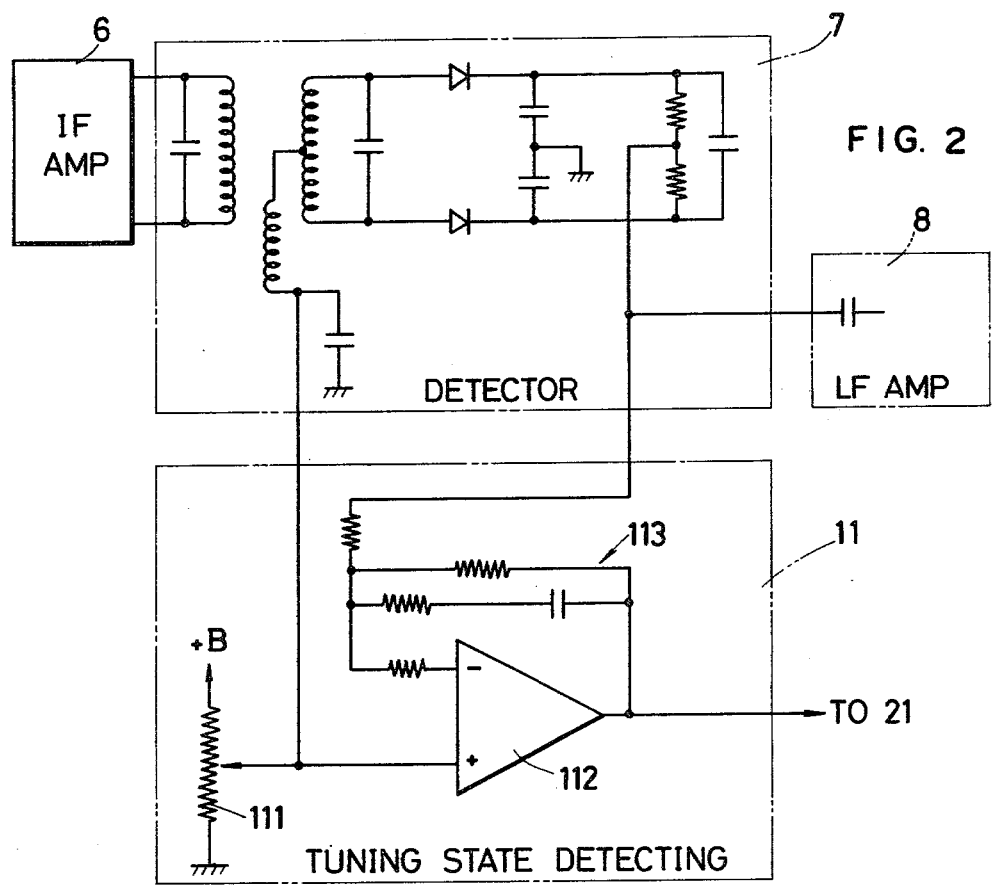
FIG. 2 is a schematic diagram showing in more detail a tuning state detecting circuit employed in the present invention.
Figure 3:
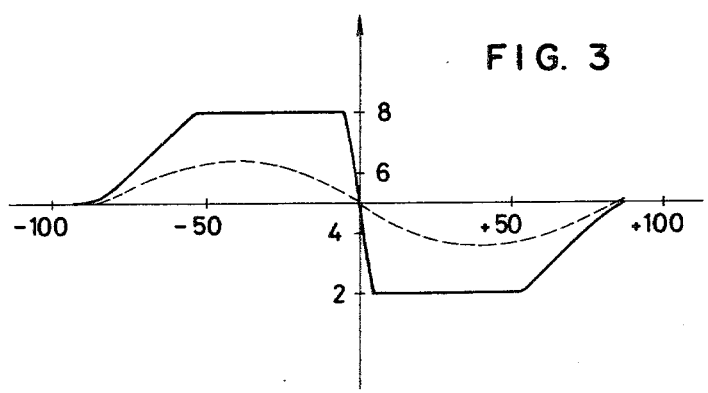
FIG. 3 is a graph showing the output voltage obtained from the tuning state detecting circuit shown in FIG. 2, wherein the abscissa indicated the frequency deviation and the ordinate indicates the voltage.

FIG. 2 is a schematic diagram showing in more detail the tuning state detecting circuit 11 and the detector 7. The detector 7 may comprise a ratio detector, for example. The tuning state detecting circuit 11 comprises an operational amplifier 112. The plus input terminal of the operational amplifier 112 is supplied with a signal obtained from the above described demodulator or the detector 7 or 7', while the minus input terminal of the operational amplifier 112 is supplied with the demodulated output obtained from the circuit 7 through a suitable resistor. The plus input terminal of the operational amplifier 112 is further connected to a slidable contact of a variable resistor 111. One end of the variable resistor 111 is connected to ground, while the other end of the variable resistor 111 is connected to receive the +B voltage, whereby the voltage applied to the plus input terminal of the operational amplifier is corrected, so that the output voltage of the detecting circuit 11 on the occasion of no input signal, i.e. on the occasion of absence of a broadcasting signal, is determined. A low pass filter 113 is interposed between the minus input terminal of the operational amplifier 112 and the output terminal, whereby the output of the circuit 11 is applied to the control circuit 20 as described previously. The output of the tuning state detecting circuit 11 shown in FIG. 2 is shown in FIG. 3. As seen from FIG. 3, the tuning state detecting circuit 11 is aimed to amplify a normal S shaped curve shown by the dotted line in FIG. 3. To that end, the operational amplifier 112 is structured such that the same has a relatively large gain so as to function as a kind of a saturation amplifier. Accordingly, the S shaped curve signal as shown by the dotted line in FIG. 3 becomes saturated to be that as shown by the solid line. The said signal is applied to the control circuit 20.

FIG. 4 is a block diagram showing in some detail the remaining major portion in the FIG. 1 diagram. Referring to FIG. 4, the operation switch 12 is shown in detail. The operation switch 12 comprises an upward switch 12$u$ for instructing the scanning operation in the upward direction and a downward switch 12$d$ for instructing the scanning operation in the downward direction. One end of each of these switches 12$u$ and 12$d$ is commonly connected to ground, while the other end of each of these switches 12$u$ and 12$d$ is connected to the corresponding one of inverters 121 and 122, respectively. The output of the inverter 121 is connected to one input of a NOR gate 125 and the set input S of a flip-flop 126 and is also applied to an input of a NOR gate 124. The output of the inverter 122 is applied to the NOR gate 125 as the other input thereto and is also applied through an inverter 123 to the remaining input of the above described AND gate 124. The output of the AND gate 124 is applied to the reset input R of the flip-flop 126. The output of the NOR gate 125 is obtained as a signal representing depression of the above described upward switch 12$u$ or the downward switch 12$d$ and is applied to the timer 13 as a triggering signal and is also applied to the sequence control logic circuit 22 included in the control circuit 20. The flip-flop 126 is aimed to store an indication of the depression of the upward switch 12$u$ or the downward switch 12$d$ and is adapted such that the output Q of the flip-flop 126 becomes the logic one when the upward switch 12$u$ is turned on and becomes the logic zero when the downward switch 12$d$ is turned on. The output Q is applied to the sequence control logic circuit 22 included in the control circuit 20 and is also applied to the count speed selection circuit 30.

The low repetition frequency rate clock generator 14 and the high repetition frequency rate clock generator 15 are shown in detail in FIG. 5. More specifically, the high repetition frequency rate clock generator 15 comprises an oscillator 151 for generating a fundamental clock pulse, the output of which is shown in FIG. 6A, for example. The output of the oscillator 151 is obtained through the inverter 152 as a clock pulse CL1 shown in FIG. 6C and is applied to the triggering input T of a trigger flip-flop 141 and one input of the NOR gate 142 included in the low repetition frequency rate clock generator 14. The low repetition frequency rate clock generator 14 receives the output Q shown in FIG. 6B of the flip-flop 141 at the other input of the NOR gate 142. Accordingly, the output of the NOR gate 142 is obtained from the circuit 14 as a low repetition frequency rate clock pulse CL2 shown in FIG. 6B. These high repetition frequency rate clock pulse CL1 and low repetition frequency rate clock pulse CL2 signals are applied to the count speed selection circuit 30.

The control circuit 20 comprises the wind comparator 21, the sequence control logic circuit 22 and the state storing flip-flops 23 and 24, as shown in FIG. 4. The wind comparator 21 is shown in detail in FIG. 7. As seen from FIG. 7, the wind comparator 21 is adapted to receive at the input thereto the output (FIG. 3) of the tuning state detecting circuit 11. The output of the tuning state detecting circuit 11 is connected to the plus input terminal of the comparator 211 and is also connected to the minus input terminal of the comparator 212. Resistors R1, R2, and R3 are connected in series and one end of the series connection is connected to the ground while the other end of the series connection is supplied with the reference voltage Vref. The voltage $V_L$ at the junction of the resistors R1 and R2 is applied to the minus input terminal of the comparator 211 and the voltage $V_H$ at the junction of the resistors R2 and R3 is applied to the plus input terminal of the comparator 212. The voltage $V_L$ serves as a reference voltage or a comparison voltage of the comparator 211 and the voltage $V_H$ serves as a reference voltage or a comparison voltage of the comparator 212. The voltages $V_L$ and $V_H$ are the voltages as divided of the reference voltage Vref by means of division resistors R1, R2 and R3, and are selected such that the same become an intermediary level of the voltages $V_L$ and $V_H$ shown in FIG. 8 on the occasion of no signal received.

Figure 8:
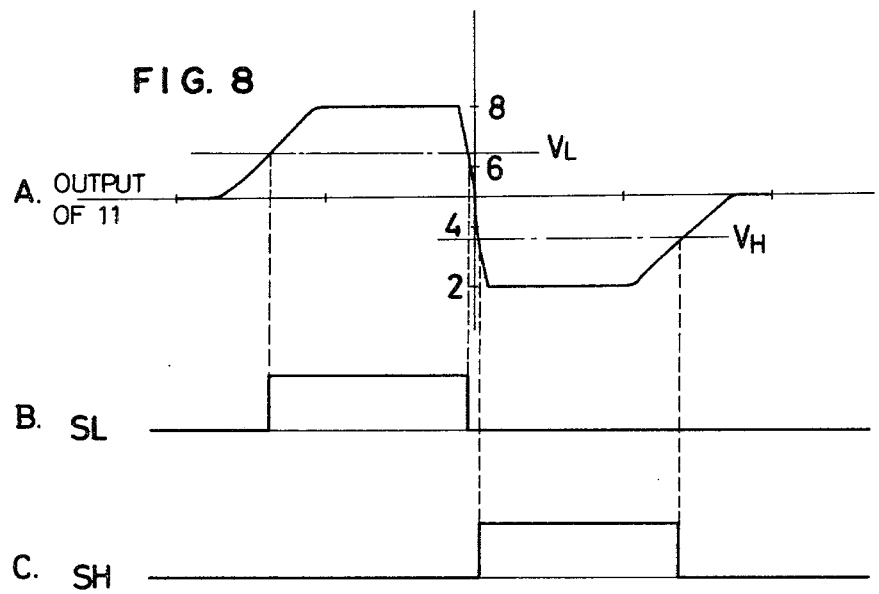
FIG. 8 shows waveforms of electrical signals for explaining the operation of the FIG. 7 diagram.

The waveforms of the wind comparator shown in FIG. 7 are shown in FIG. 8. FIG. 8A shows the output of the tuning state detecting circuit 11, i.e. the input of the circuit 21. The voltages $V_L$ and $V_H$ are shown as a threshold voltage or a comparison voltage in FIG. 8A. If and when these signals are applied to the wind comparator 21, a signal SL as shown in FIG. 8B is obtained from the comparator 211 and a signal SH as shown in FIG. 8C is obtained from the comparator 212. The signal SL assumes the logic one if and when the tuning point of the receiver falls in frequency range lower than the complete tuning point or the correct tuning point of the broadcasting signal being received. On the other hand, the signal SH assumes the logic one if and when the tuning point falls in a given frequency range higher than the correct tuning point of the broadcasting signal being received. The signals SL and SH are applied to the sequence control logic circuit 22 and also to the count speed selection circuit 30.

Figure 9:
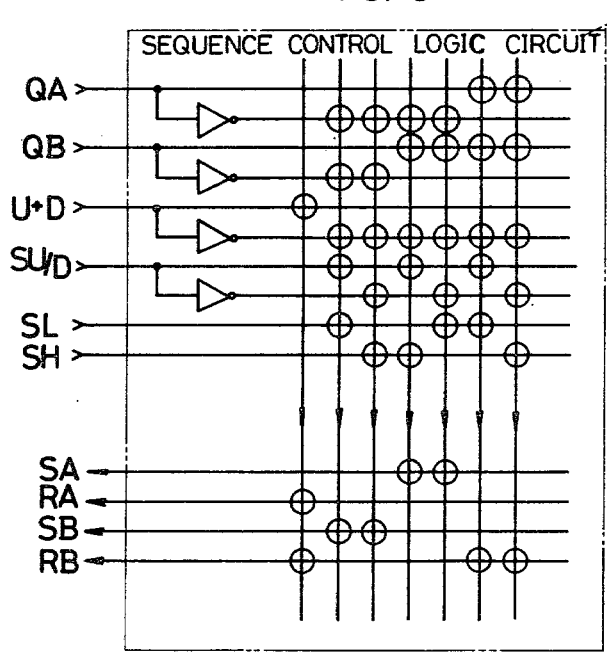
FIG. 9 is a schematic diagram showing in more detail a sequence control logic circuit 22 shown in FIG. 4.
Figure 10:
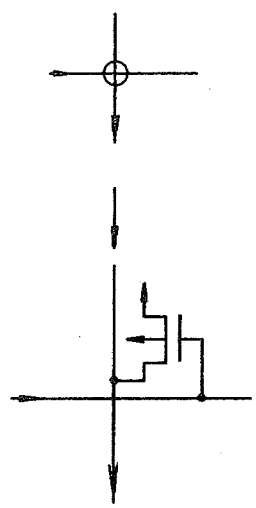
FIG. 10 is a diagram showing one example of the junction in the matrix shown in FIG. 9.

FIG. 9 is a diagram showing one example of the sequence control logic circuit 22, and FIG. 10 is a diagram showing a connection at one intersection in the read only memory shown in FIG. 9. The sequence control circuit 22 is implemented by the read only memory, which are adapted to receive the input signals QA, QB, (U+D), SU/D, SL, and SH and to provide the control signals SA, RA, SB, and RB. More specifically, the read only memory comprises a plurality of column lines corresponding to the above described inputs QA, QB, (U+D), and SU/D and a plurality of row lines corresponding to inversions of these signals and other row lines corresponding to signals SL and SH. As well-known to those skilled in the art, this type of the read only memory provides NANDed output of the input signals connected as shown in FIG. 10 is obtained from one output line. The output signal SA of the sequence control logic circuit 22 is applied to the set input S of the flip-flop 23 and the signal RA is applied to the reset input R of the flip-flop 23. The signal SB is applied to the set input S of the flip-flop 24 and the signal RB is applied to the reset input R of the flip-flop 24. The output QA of the flip-flop 23 and the output QB of the flip-flop 24 are returned to the sequence control logic circuit 22 as a signal for controlling a scanning mode to be described subsequently and are also applied to the count speed selection circuit 30.

Figure 11:
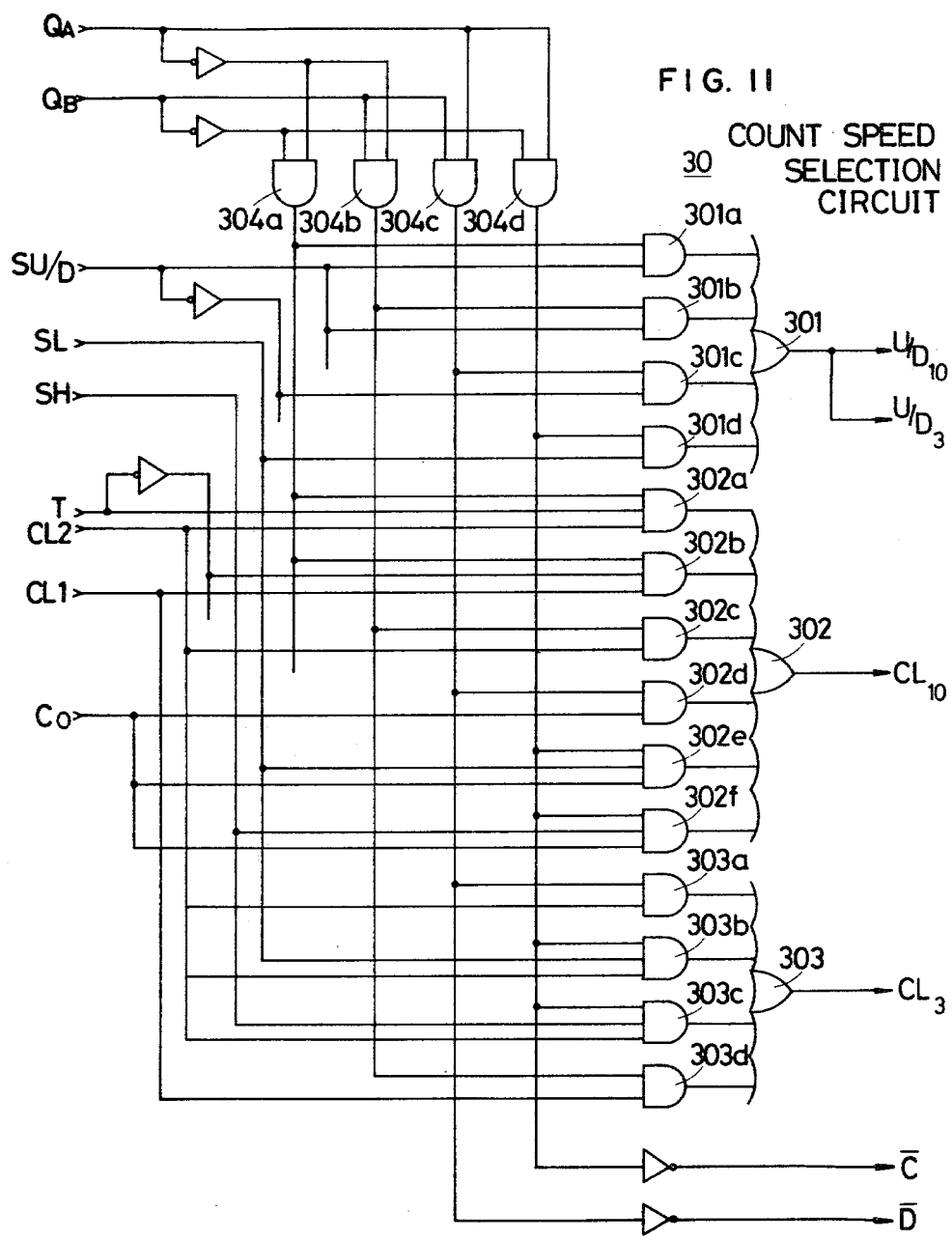
FIG. 11 is a diagram showing one example of a count speed selecting circuit 30 shown in FIGS. 1 and 4.

FIG. 11 is diagram showing in more detail one example of the count speed selection circuit 30. The count speed selection circuit 30 is connected to receive the signals QA, QB, SL, and SH from the control circuit 20, the signal SU/D from the operation switch 12, the signal T from the timer 13, the high repetition frequency rate clock CL1 fro the high repetition frequency rate clock generator 15 and the low repetition frequency rate clock CL2 from the low repetition frequency rate clock generator 14, and to further receive the carry signal Co from the three-bit up/down counter 42 included in the counter circuit 40. The count speed selection circuit 30 comprises at the output side thereof three OR gates 301, 302 and 303, wherein the OR gate 301 provides the signals U/D10 and U/D3 from the outputs of four AND gates 301a to 301d, the OR gate 302 provides the clock $CL_{10}$ from the output of six AND gates 302a to 302f, and the OR gate 303 provides the clock $CL_3$ from the outputs of the four AND gates 303a to 303d. The signal U/D10 is applied to the ten-bit up/down counter 41 included in the counter circuit 40, as an up count instruction, when the same assumes the logic one, and as a down count instruction, when the same assumes the logic zero. On the other hand, the signal U/D3 is applied to the above described three-bit up/down counter 42 similarly as an up count or down count instructing signal. The clock $CL_{10}$ is applied to the above described ten-bit up/down counter 41 as a count input, and the clock $CL_3$ is applied to the above described three-bit up/down counter 42 as a count input. The outputs of the AND gates 304c and 304d are inverted and are applied to the three-bit pulse width modulation circuit 52 as the signals $\overline{C}$ and $\overline{D}$.

The structure of the up/down counter or counter circuit 40 shown is well-known to those skilled in the art and hence a more detailed description will be omitted.

The output of the ten-bit up/down counter 41 included in the counter circuit 40 is applied in a bit parallel fashion to the ten-bit ladder circuit 51 included in the digital/analog converter 50 and the output of the three-bit up/down counter 42 is applied in a bit parallel fashion to the three-bit pulse width modulation circuit 52.

Figure 12:
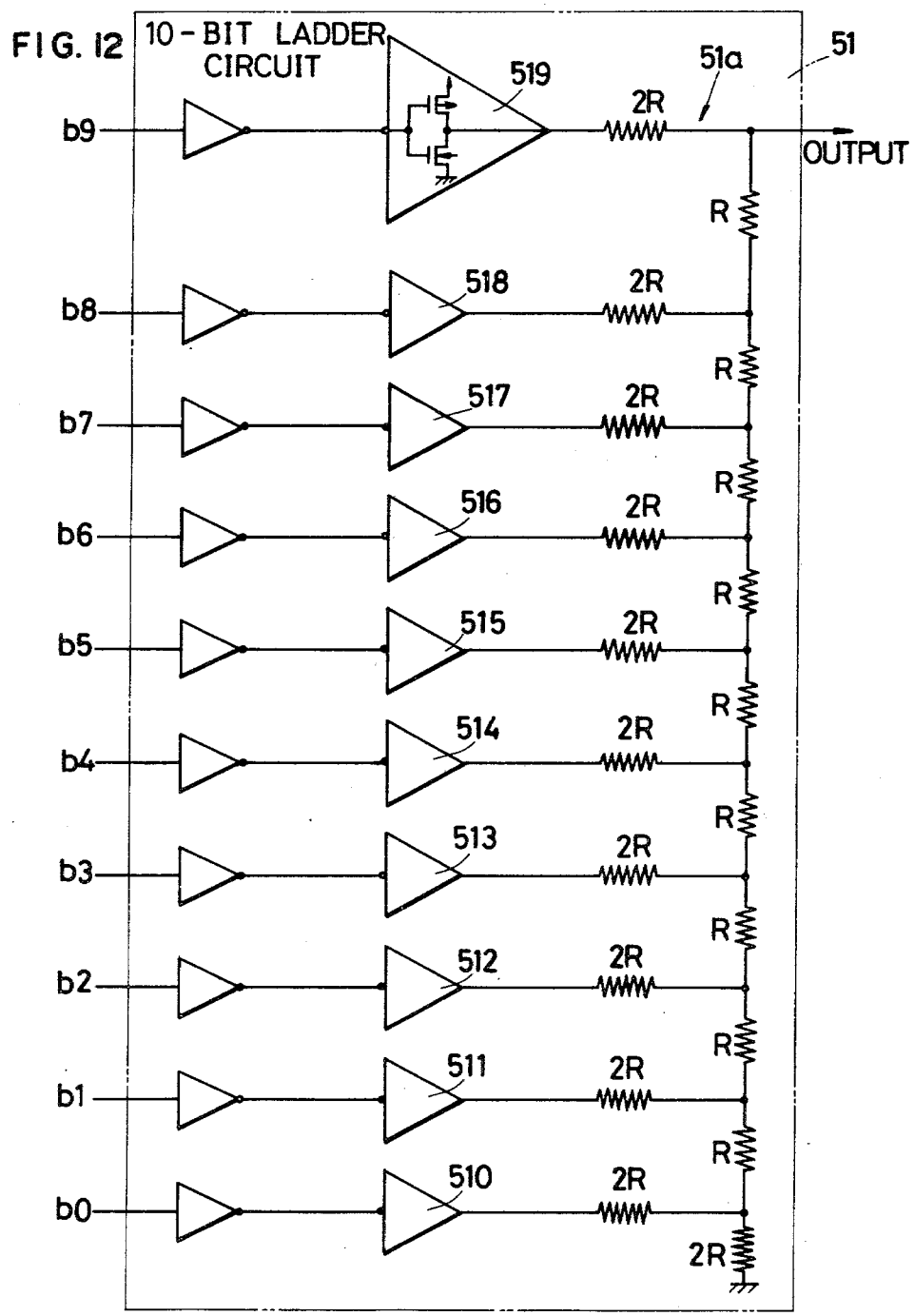
FIG. 12 is a diagram showing in more detail a ten-bit ladder circuit shown in FIG. 4.

FIG. 12 is a diagram showing one example of the ten-bit ladder circit 51 included in the digital/analog converter 50. The ladder circuit 51 is adapted to receive in a bit parallel fashion the output of the ten-bit up/down counter 41, such that these bits b0 through b9 are connected through the corresponding inverters to the corresponding switching devices 510 to 519, respectively. The outputs of these switching devices 510 to 519 are applied to the ladder network 51a as shown in FIG. 12. An analog voltage corresponding to the input bits b0 to b9 received from the ten-bit up/down counter 41 is obtained from one end of the ladder network 51a. The above described analog voltage is added to the analog voltage obtained from the three-bit pulse width modulation circuit 52 shown briefly in FIG. 4 and shown specifically in FIG. 13, thereby to provide the output from the circuit 50 as a tuning voltage.

FIG. 13 is a schematic diagram showing in detail the above described three-bit pulse width modulation circuit 52 shown in FIG. 4. The three-bit pulse width modulation circuit 52 comprises a three-bit binary counter 521 and a three-bit comparator 522. The binary counter 521 may be implemented by a series connection of trigger flip-flops adapted to receive the clock pulse CL1 from the high repetition frequency rate clock generator 15 and the outputs Q1, Q2 and Q3 of the respective flip-flops are applied to the corresponding comparison inputs of the comparator 522. The comparator 522 is connected to receive the bit outputs a0, a1, and a2 from the three-bit up/down counter 42 shown in FIG. 4 for the purpose of comparison with the outputs Q1, Q2 and Q3, respectively. Referring to the comparator 522, the output of the NAND gate 522a is determined in the following manner. More specifically, referring to the comparator 522, if and when the numerical value a represented by the in put bits a0, a1 and a2 is compared with the data Q represented by the outputs Q1, Q2 and Q3 of the three-bit binary counter 521 and the relation $a(=a2\cdot 2^2+a1\cdot 2+a0)<Q(=Q3\cdot 2^2+Q2\cdot 2+Q1)$ is met, then the output of the logic one is obtained from the NAND gate 522a. The output obtained from the gate 522a is applied to the NAND gate 522b as one in put thereto. The NAND gate 522b is connected to receive, at the other input thereto, the output of the OR gate 522c to which an inversion of the signals $\overline{C}$ and $\overline{D}$ is applied. Accordingly, the output of the circuit 52 is obtained if and when either the signal $\overline{C}$ or $\overline{D}$ is the logic zero. Now referring to FIG. 4, the output of the ten-bit ladder circuit 51 and the output of the three-bit pulse width modulation circuit 52 are subjected to voltage addition, thereby to provide an output from the thirteen-bit digital/analog converter 50. A resistor 532 and a capacitor 533 of the digital/analog converter 50 shown in FIG. 4 constitute an integrating circuit the characteristic of which is determined by the periodicity of the three-bit pulse width modulation circit 52. The sum of the resistance values of the resistors 531 and 532 is determined in association with the output impedance of the ten-bit ladder circuit 51, thereby to determine the ratio of voltage addition of the output voltages of the ladder circuit 51 and the three-bit pulse width modulation circit 52. Assuming, for example, that the output impedance of the ten-bit ladder circuit 51 is R0, then the sum of the resistance value R1 of the resistor 531 and the resistance value R2 of the resistor 532 are selected in the following manner. More specifically, $R1+R2=2^{10}R0=1024R0$.

With such structure as described in the foregoing, an operation of the embodiment shown in FIGS. 1 and 4 will be described in more detail. Prior to the description of operation, it is assumed that in the following description such FM receiver 1 as shown in FIG. 1 (and in FIG. 20) has been structured such that an increase of the tuning voltage obtained from the digital/analog converter 50 accordingly increases the tuning frequency or the frequency being received.

FIG. 14 is a flow diagram showing a sequence of the scanning operation in the upward direction by a digital automatic scanning tuner of the embodiment shown, and FIG. 15 is a timing chart for explaining one example of the scanning operation in accordance with the operation sequence thereof. Now referring to FIGS. 14 and 15, description will be made of the scanning operation in the upward direction by the embodiment shown in FIGS. 1 and 4. First let it be assumed that a power switch, not shown, is turned on, whereby the receiver 1 is energized, whereupon the upward switch 12u included in the operation switch 12 is turned on. Accordingly, a signal U+D representing that the switch 12u is turned on is obtained from the NOR gate 125, so that the timer 13 is triggered and the same is also applied to the sequence control logic circuit 22 included in the control circuit 20. At that time the flip-flop 126 is set, whereby the signal SU/D is obtained responsive to the output Q and is applied to the sequence control logic circuit 22 and to the count speed selection circuit 30 as well. Accordingly, the time signal T of the logic one is obtained from the timer 13 and is applied to the count speed selection circuit 30. On the other hand, the flip-flops 23 and 24 included in the control circuit 20 remain reset, so that the outputs QA and QB both remain the logic zero. Accordingly, the output of the AND gate 301a and thus the output of the OR gate 301 obtained from the count speed selection circuit 30 shown in FIG. 11 becomes the logic one and is withdrawn as the signal $U/D_{10}$ and $U/D_3$. The low repetition frequency rate clock CL2(FIG. 6D) is obtained through the AND gate 302a from the OR gate 302 as the clock $CL_{10}$ for the ten-bit counter 41. Accordingly, the ten-bit up/down counter 41 makes a count up operation responsive to the low repetition frequency rate clock CL2. Therefore, the output voltage from the ten-bit ladder circuit 51 and thus the tuning voltage varies at a lower speed. Thus, the tuning voltage varying at the low speed is applied to the high frequency amplifier 3 and the local oscillator 5 and accordingly the frequency of the local oscillation frequency signal obtained from the local oscillator 5 also varies at the low speed, whereby the low speed scanning operation in the upward scanning mode I (see FIG. 15) of the scanning operation mode is achieved. The above described low speed scanning operation at the beginning of the scanning operation is particularly effective to prevent an erroneous scanning operation of a station closer to the scanning start point caused by delay of operation by virtue of the circuit components, delay in reaching a stabilized state of the local oscillator 5 comprising a voltage controlled oscillator and the like. In a preferred embodiment, the clock CL2 in the low speed scanning mode of the upward scanning mode I is selected to be a speed requiring a time period of 6m sec per one count by the ten-bit up/down counter 41 and the time period of the timer 13 is determined as 500m sec. Accordingly, for the time period of 500m sec from the start of the scanning operation the low speed scanning operation of the upward scanning I is carried out as shown in the FIG. 15 timing chart.

Thereafter, after the conclusion of a predetermined time period of the timer 13, say the above described 500m sec, the signal T from the timer 13 becomes the logic zero. Accordingly, the high repetition frequency rate clock pulse CL1 as shown in FIGS. 5 and 6 is obtained from the AND gate 302b and thus from the OR gate 302 of the count speed selection circuit 30 shown in FIG. 11 as the clock $CL_{10}$ being applied to the ten-bit up/down counter 41. Accordingly, the ten-bit up/down counter 41 shown in FIG. 4 makes a count up operation responsive to the above described high repetition frequency rate clock pulse CL1. Therefore, the analog voltage obtained from the ten-bit ladder circuit 51 of the digital/analog converter 50, i.e. the turning voltage also varies at the high speed, thereby to perform the high speed scanning in the upward scanning mode II of the scanning operation mode as shown in the FIG. 15 timing chart. Thus, if and when the scanning operation is switched from the low speed scanning being performed for a predetermined time period from the start of the scanning to the high speed scanning operation, then malfunction in the scanning operation is eliminated while the time period required for the automatic scanning can be shortened. In a preferred embodiment, the high speed scanning operation is adapted to be effected at as high as two times the speed of the low speed scanning operation, say 3m sec/digit.

In the course of such high speed scanning operation in the above described upward scanning mode I, if a broadcasting signal of a given broadcasting station is received, a signal as shown in FIG. 3 is obtained from the tuning state detecting circuit 11 fully depicted in FIG. 2 and is applied to the wind comparator 21 (FIG. 7) included in the control circuit 20. Since the receiver 1 was assumed to be in the upward scanning operation mode, a signal SL shown in FIG. 8B is first obtained from the wind comparator 21. Accordingly, a signal SB is obtained from the sequence control logic circuit 22 (FIG. 9) as the logic one, which is then applied to the flip-flop 24. Therefore, the flip-flop 24 is set, with the result that the output $Q_B$ becomes the logic one. Accordingly, a carry signal Co obtainable from the three-bit up/down counter 42 is obtained through the AND gate 302c and thus through the OR gate 302 of the count speed selection circuit 30 (FIG. 11) and is applied to the ten-bit up/down counter 41 as the clock $CL_{10}$. On the other hand, at that time the high repetition frequency rate clock pulse CL1 is provided from the AND gate 303d and thus from the OR gate 303 of the count speed selection circuit 30 as the count clock $CL_3$ of the three-bit up/down counter 42. The signals $U/D_{10}$ and $U/D_3$ from the circuit 30 are both the logic one. Accordingly, the three-bit up/down counter 42 makes a step operation responsive to the high repetition frequency rate clock pulse CL1 and one carry signal Co is obtained at every eighth count. The above described carry signal Co is applied to the ten-bit up/down counter 41, as described previously. Therefore, the ten-bit up/down counter 41 provides to make one up count each time eight high repetition frequency rate clock pulses CL1 are obtained. In other words, in the upward scanning mode II after the signal SL is thus detected, the above described high speed scanning operation is slowed down as slow as one eighth the above described high speed scanning operation. Thus, the upward scanning operation mode II as shown in the FIG. 15 timing chart is initiated therefrom, whereby the tuning frequency of the receiver 1 varies in the upward direction at the low speed.

The above described low speed scanning operation, i.e. the upward scanning operation mode II is continued, so that the signal SH as shown in FIG. 8C is continually obtained from the wind comparator 21 shown in FIG. 7 as the logic one. Accordingly, the signal SA is withdrawn from the sequence control logic circuit 22 (FIG. 9) included in the control circuit 20 as the logic one. Therefore, the subsequent stage flip-flop 23 is set and the output $Q_A$ of the flip-flop 23 becomes the logic one. More specifically, at that time point the two flip-flops 23 and 24 are both set, so that the outputs $Q_A$ and $Q_B$ both become the logic one. The outputs $Q_A$ and $Q_B$ of the logic one are applied to the count speed selection circuit 30 (FIG. 11), whereby the output of the AND gate 304c becomes the logic one. Accordingly, the signals $U/D_{10}$ and $U/D_3$ from the OR gate 301 included in the circuit 30 both become the logic zero. Accordingly, the ten-bit up/down counter 41 and the three-bit up/down counter 42 included in the counter circuit 40 are both rendered in the down count mode. The clock pulse CL2 obtainable from the low repetition frequency rate clock generator 14 is obtained from the AND gate 303a and thus from the OR gate 303 of the count speed selection circuit 30 as the clock $CL_3$ being applied to the three-bit up/down counter 42. Accordingly, the three-bit up/down counter 42 is caused to make a down count operation responsive to the low repetition frequency rate clock pulse CL2, whereby a carry signal Co is obtained at each count of eight low repetition frequency rate clock pulses CL2. Therefore, the carry signal Co obtainable from the three-bit up/down counter 42 is provided from the AND gate 302d and thus from OR gate 302 of the count speed selection circuit 30 as the clock $CL_{10}$ being applied to the ten-bit up/down counter 41. At that time the signal $\overline{D}$ obtainable from the count speed selection circuit 30 becomes the logic zero and the output is obtained from the AND gate 522b of the three-bit pulse width modulation circuit 52 shown in FIG. 13. The analog voltage obtainable from the three-bit pulse width modulation circuit 52 is added to the output of the ten-bit ladder circuit 51, thereby to provide the output as a tuning voltage. More specifically, the signal SL is thus detected in the upward scanning mode, which is followed by detection of the signal SH, whereupon the scanning direction is changed to the downward direction, when the three-bit pulse width modulation circuit 52 is operable. This means that in the downward scanning operation after detection of the signal SH a variation of the tuning voltage being applied to the receiver 1 is a slow variation wherein a variation components per each clock pulse is small, as shown in FIG. 16, as different from the case of the upward scanning operation mode II. More specifically, a decreased variation components per each clock pulse brings about an advantage that the tuning operation can be attained with accuracy. Thereafter, the downward scanning operation of the increased resolution is continued, which is followed by the signal SL obtained from the wind comparator 21 included in the control circuit 20, as seen from the FIG. 15 timing chart.

If and when the signal SL is obtained as described previously, the signal RB is obtained as the logic one from the sequence control logic circuit 22 shown in FIG. 9. Accordingly, the corresponding flip-flop 24 is reset, whereby the output $Q_B$ thereof becomes the logic zero. Therefore, while the signal from the OR gate 301 of the count speed selection circuit 30 shown in FIG. 11 remains the logic zero, neither clock pulse $CL_{10}$ nor $CL_3$ comes to be obtained from the OR gates 302 and 303 simultaneously, whereby the counter 40 maintains the count state. Accordingly, the voltage obtained from the digital/analog converter 50 is also maintained and thus the tuning point of the high frequency amplifier 3 and the local oscillator 5 of the receiver 1 remains at the point A shown in FIG. 15. More specifically, the above described point A denotes a correct tuning point of the broadcasting signal A. Thus, the automatic scanning operation in the upward direction is achieved.

FIG. 17 is a flow diagram showing a sequence of the scanning operation in the downward direction in accordance with the embodiment shown in FIGS. 1 and 4, and FIG. 18 is a timing chart for explaining the automatic scanning operation in the downward direction. It is pointed out that the automatic scanning operation in the downward direction is substantially the same as the above described automatic scanning operation in the upward direction, except that the directional relation is directly reversed. Accordingly, the automatic scanning operation in the downward direction will be briefly described. In case of the downward directional scanning operation, the downward switch 12d included in the operation switch 12 is first turned on. Then the timer 13 is triggered and the low speed scanning operation as low as a half of the high speed downward scanning operation of the downward scanning operation mode I as shown in FIG. 18 is initiated. After the lapse of a predetermined time period determined by the timer 13, say 500m sec, the clock pulse $CL_{10}$ being applied to the up/down counter 41 is switched to the clock pulse CL1 obtainable from the high repetition frequency rate clock generator 15, whereby the high speed downward scanning operation is performed. In the above described downward scanning operation mode I, the signal SH is obtained from the wind comparator 21 responsive to the output signal obtained from the tuning state detecting circuit 11, which is followed by switching to the downward scanning operation mode II, whereby the low speed downward scanning operation as low as one eighth of the speed of the high speed downward scanning operation is performed. Then the signal SL is obtained from the wind comparator 21 and both the flip-flops 23 and 24 included in the control circuit 22 are placed in the set state, whereby the scanning direction is switched to the upward direction. At the same time, the three-bit pulse width modulation circuit 50 becomes operable or starts operation, whereby the upward scanning operation of an enhanced resolution, i.e. the low speed upward scanning operation by a fine variation of the tuning voltage, is performed. If and when the signal SH is obtained again from the wind comparator 21, the counter circuit 40 ceases a stepping operation with the above described point (FIG. 18) as a correct tuning point of the broadcasting signal B, whereby the receiver 1 maintains the above described tuning point B.

Figure 19B:
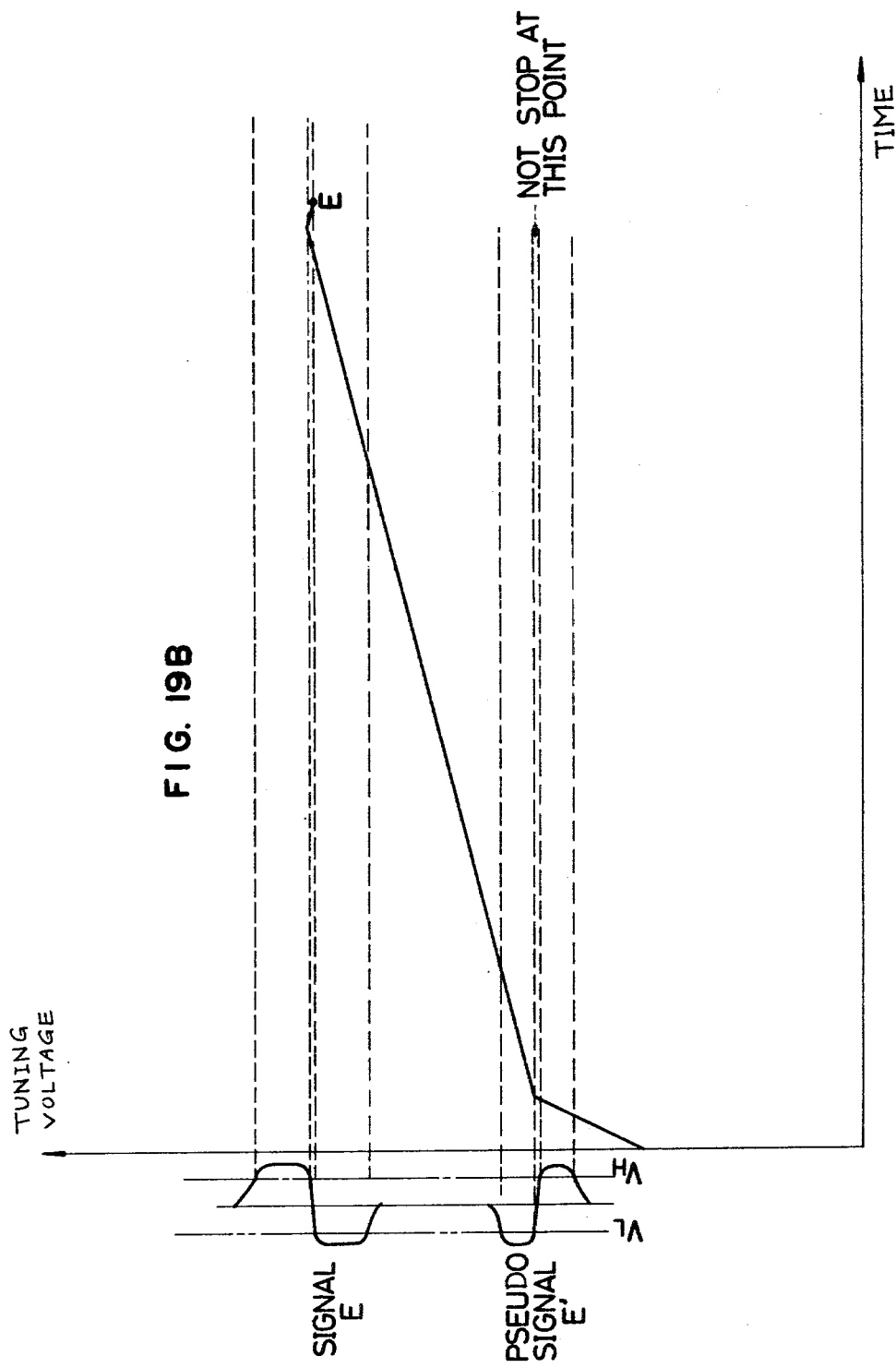

FIGS. 19A and 19B are timing charts for explaining such feature of the embodiment. More specifically, FIG. 19A shows an upward scanning operation, for example, in case where the broadcasting frequencies are adjacent to each other, while FIG. 19B shows a timing chart for explaining that a tuning operation is not effected with respect to a pseudo signal such as an image.

At the outset, description will be made of the case of FIG. 19A. In this instance, it has been assumed that the broadcasting signal C and the broadcasting signal D are close to each other in terms of the frequencies. First of all the upward scanning operation is performed to reach a complete tuning point of the broadcasting signal C, i.e. a correct tuning point C. Then the scanning operation for catching a correct tuning point D of the broadcasting signal D is initiated. In such a situation, since the scanning operation is started from the correct tuning point C of the braodcasting signal in the upward direction, the signal SH is obtained from the wind comparator 21 included in the control circuit 20 immediately after the start of the above described low speed upward scanning operation. However, the scanning operation mode is continued without being changed responsive to the signal SH obtainable at that time. Then the signal SL representing the broadcasting signal D is obtained. Accordingly, the scanning operation mode is changed to the above described upward scanning operation mode II. At that time the signal SH is detected and then the signal SL is detected, the scanning direction is not reversed at that point. In other words, although there might be a case where neither the signal SL nor SH is detected between the brodcasting signal C and the broadcasting signal D, the apparatus does not terminate the scanning operation at such point. More specifically, the apparatus is adapted such that only if and when the signal SL of the broadcasting signal D is detected which is followed by detection of the signal SH of the broadcasting signal D the scanning direction is reversed. In the course of the scanning operation in the above described reversed scanning direction, the signal SL of the broadcasting signal D is detected again. The very point where the signal SL of the broadcasting signal D is again detected is a correct tuning point D of the desired broadcasting signal D. Thus, the scanning operation is terminated at the very point D.

Referring to FIG. 19B, description will be made of the fact that the embodiment shown is not tuned to a pseudo signal such as an image or spurious signal. First of all the upward switch 12u is turned on and the upward scanning operation mode I is thus initiated. In the course of the upward scanning operation mode I, a signal SH representing a pseudo signal E' is detected. However, since the apparatus is irresponsive to the first signal SH in the upward scanning operation, the upward scanning operation mode I is continued, whereupon the signal SL representing a pseudo signal E' is detected. Then a shift is made to the upward scanning operation mode II, whereby the low speed upward scanning operation is performed. In the upward scanning operation mode II, the signal SL representing a normal broadcasting signal E is detected. In the normal upward scanning operation, upon detection of the signal SL a shift is made to the upward scanning operation mode II, but in this particular case the upward scanning operation mode II has been already regained and therefore the upward scanning operation mode is continued. Thereafter the signal SH representing the normal broadcasting signal E is detected, when the scanning direction is reversed while the three-bit pulse width modulation circuit 52 is enabled, with the result that the downward scanning operation of the low speed and fine voltage variation is performed. Again the signal SL of the normal broadcasting signal E is detected, whereby this point E is caught as a correct tuning point. Thus, it would be appreciated that the embodiment shown has been irresponsive or immune to a pseudo signal such as an image or spurious. In other words, even if any signal deemed as a signal SL or SH by virtue of a noise component or a pseudo signal is detected, the scanning operation is not terminated, unless detection of the signal SL is followed by detection of the signal SH in the upward scanning operation or unless detection of the signal SH is followed by detection of the signal SL in the downward scanning operation, with the result that it is assured that the scanning operation can be terminated only if and when the normal broadcasting signal is received or a correct reception state is established. If and when an additional circuit is provided for returning the apparatus to the high speed scanning operation unless the signal SH or SL is detected after the lapse of a predetermined time period since the signal SL or SH is detected, the same serves to shorten the scanning time period. Such additional circuit may be achieved with ease by those skilled in the art.

The apparatus may be structured such that in case where the broadcasting signal selected in the above described manner is unnecessary, again the switch 12u or 12d included in the operation switch 12 may be operated to restart the scanning operation. Alternatively, the apparatus may be structure such that if the selected broadcasting signal is a desired one a scanning terminating signal may be provided. In the latter mentioned case, the apparatus may be further structured such that the scanning operation in the same scanning direction may be regained unless such scanning terminating signal is provided even after the lapse of a prescribed time period after the correct tuning point is attained. Such modifications can be made with ease by those skilled in the art.

Although in the foregoing the above described digital automatic scanning tuner was described as implemented in a hardware implementation and a digital preset tuner will be described subsequently again as implemented in a hardware implementation, it is needless to say that such tuner may be implemented by employing a microprocessor and by properly programming the same in a software implementation. p FIG. 20 is a block diagram showing a digital preset tuner by way of another embodiment of the present invention. It is pointed out that in description of the FIG. 20 embodiment the same components as those of the above described digital automatic scanning tuner have been denoted by the same reference characters. Since the embodiment shown is directed to a preset tuner, the same comprises a channel selection switch group 19 including a plurality of channel selection switches and an address selection circuit 60 for selecting the address of the memory 70 in association with a channel selection signal obtained from the channel selection switch group 19. The address selection circuit 60 serves to designate the address of the memory 70 and also to provide to the control circuit 20 a signal representing which one of the switches included in the switch group 19 is selected, thereby to render the control circuit 20 in a tuning mode of the preset operation. The memory 70 may comprise a random access memory having the capacity of ten bits×five words, for storing the count value in the ten-bit up/down counter 41 included in the counter circuit 40. The output of the memory 70 is applied to the ten-bit up/down counter 41 as preset data. Thus, the ten-bit up/down counter 41 included in the counter circuit 40 is implemented as a presettable counter. The embodiment shown further comprises an analog switch 16. The analog switch 16 is aimed to selectively switch the manual operation mode and the preset operation mode and is controlled responsive to the signal obtained from the control circuit 20. The contact 16m of the analog switch 16 is allotted to the manual operation mode, while the contact 16p of the analog switch 16 is allotted to the preset operation mode. The contact 16m allotted to the manual operation mode is connected to a slider of a variable resistor 17. One end of the variable resistor 17 is connected to the ground, while the other end of the variable resistor 17 is supplied with the positive voltage +B. The contact 16p allotted to the preset operation mode is applied to one input of the voltage comparator 18, as in case of the output of the digital-/analog converter 50. The other input of the voltage comparator 18 is supplied with the output voltage from the mode section switch 16. The output voltage from the mode selection switch 16 is also applied to the high frequency amplifier 3 and the local oscillator 5 of the FM receiver 1 as a tuning voltage. The comparator 18 serves to compare these two input voltages to provide the output to the control circuit 20.

Figure 21:
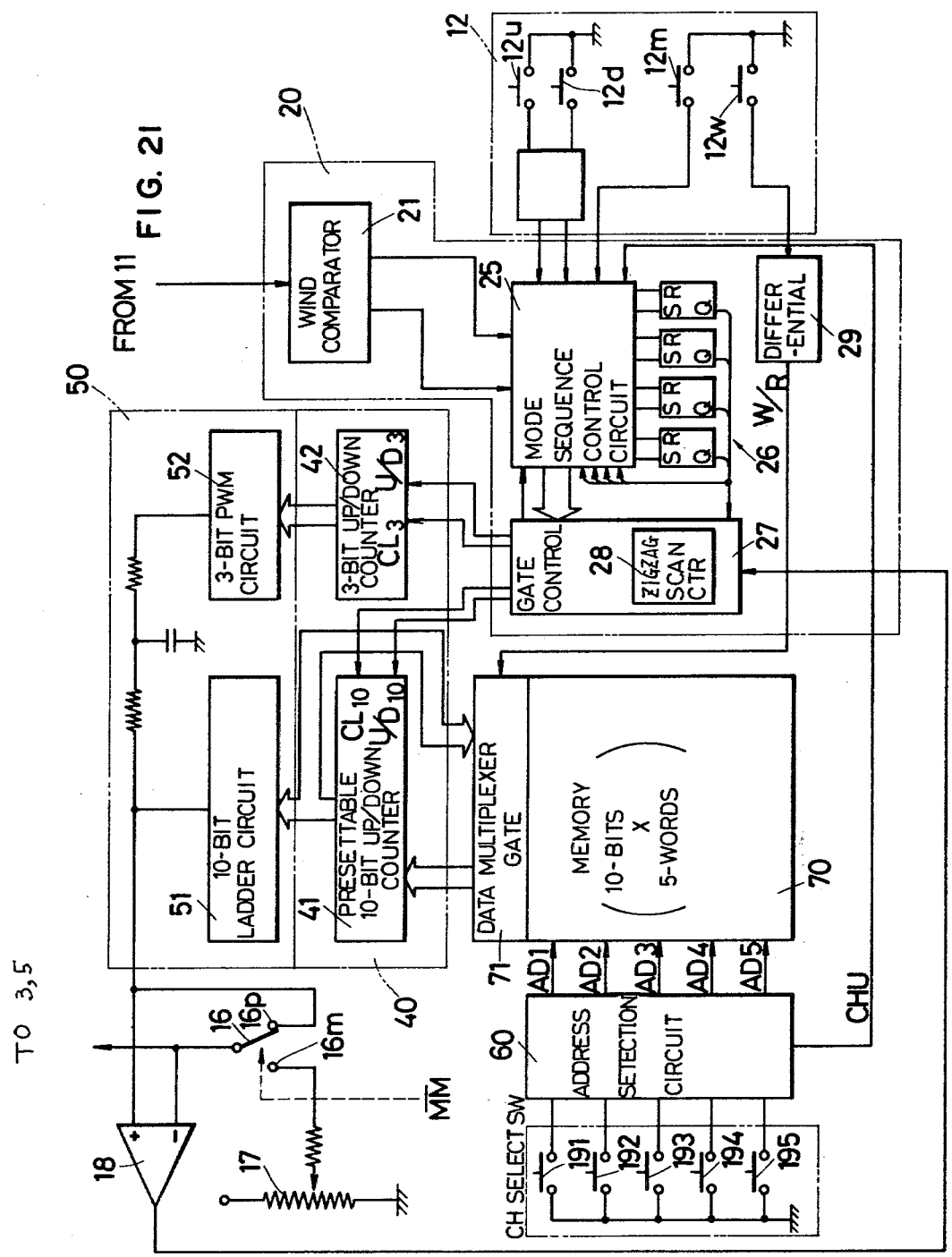
FIG. 21 is a block diagram showing in more detail a major portion of the FIG. 20 embodiment.

FIG. 21 is a block diagram showing in more detail one example of the FIG. 20 digital preset tuner. It is pointed out that the counter circuit 40 and the digital-/analog converter 50 are the same as those shown in FIG. 4.

The operation switch 12 comprises the above described upward switch 12u and the downward switch 12d, assuming that the embodiment shown also has a function of an automatic scanning tuner. The apparatus is further provided with a manual switch 12m for setting the manual operation mode and a write switch 12w for setting the write operation mode in the preset operation mode. An operation signal of the manual switch 12m is applied to a mode sequence control circuit 25 included in the control circuit 20. An operation signal of the write switch 12w is applied to a differentiation circuit 29 included in the control circuit 20. The differentiation circuit 29 is responsive to operation of the switch 12w to generate a differentiation pulse, which is applied to a memory 70 as a write command signal.

The control circuit 20 comprises a wind comparator 21 such as described in the above described embodiment. The signals SL and SH obtained from the wind comparator 21 are applied to the above described mode sequence control circuit 25. The mode sequence control circuit 25 will be described subsequently in more detail with reference to FIGS. 24A, 24B and 24C. The mode sequence control circuit 25 is also connected to a mode sequence flip/flop 26, such that the flip-flop 26 is reversed of the storing state responsive to the signal obtained from the circuit 25. The output of the flip-flop 26 is applied to a gate control circuit 27. The output of the mode sequence flip-flop 26 is further returned to the mode sequence control circuit 25. The control signal obtained from the mode sequence control circuit 25 is applied to the gate control circuit 27. The gate control circuit 27 will be described subsequently in more detail with reference to FIGS. 25A and 25B. The gate control circuit 27 comprises a zigzag control circuit 28 as to be more fully described subsequently with reference to FIGS. 26 and 27.

The gate control circuit 27 provides a signal to the mode sequence control circuit 27 and also provides the respective count clock pulses as well as a command signal of an up count or a down count to the presettable ten-bit up/down counter 41 and the three-bit up/down counter 42.

The channel selection switch group 19 comprises five channel selection switches 191, 192, 193, 194 and 195, for example, the respective operation signals of which are applied to the address selection circuit 60. The address selection circuit 60 is responsive to selection of the respective channel selection switches 191 to 195 to provide the address signals AD1 to AD5 to a random access memory 70. At the same time, the address selection circuit 60 is responsive to selection of any of the switches 191 to 195 to provide a signal CHU, which is applied to the above described mode sequence control circuit 25. The memory 70 is provided with an input-/output port or a data multiplexer gate 71. The data multiplexer gate 71 serves to transfer the data in the memory 70 to the presettable ten-bit up/down counter 41 included in the counter circuit 40 as the preset data, while the gate 71 is responsive to the write command signal obtained from the differentiation circuit 29 to write the data in the counter 41 to the address as specified by the address signals AD1 to AD5. Accordingly, the output of the presettable ten-bit up/down counter 41 is applied to the ten-bit ladder circuit 51 included in the digital/analog converter 50 in a bit parallel fashion and is also applied to the memory 70 and thus to the data multiplexer gate 71 in a bit parallel fashion. The three-bit up/down counter 42 included in the counter circuit 40 need not be a presettable type and the output of the three-bit up/down counter 42 is applied to the three-bit pulse width modulation circuit 52 included in the digital/analog converter 50 in a bit parallel fashion. The respective analog voltages obtained from the ten-bit ladder circuit 51 and the three-bit pulse width modulation circuit 52 are subjected to addition, as described previously, thereby to provide an output from the circuit 50. The added analog voltage is applied to the plus input of the voltage comparator 18 and is also applied to the contact 16p for the preset operation mode of the mode selection switch 16. The voltage obtained from the variable resistor 17 is applied to the contact 16m of the switch 16, as described previously. The output of the switch 16 is applied to the minus input of the voltage comparator 18 and is withdrawn as a tuning voltage. The analog switch 16 is controlled responsive to the signal $\overline{MM}$ obtained from the mode sequence control circuit 25, as to be described subsequently. More specifically, when the signal $\overline{MM}$ assumes the logic zero, the analog switch 16 is turned to the contact 16m and otherwise the analog switch 16 is normally turned to the contact 16p.

Figure 22:
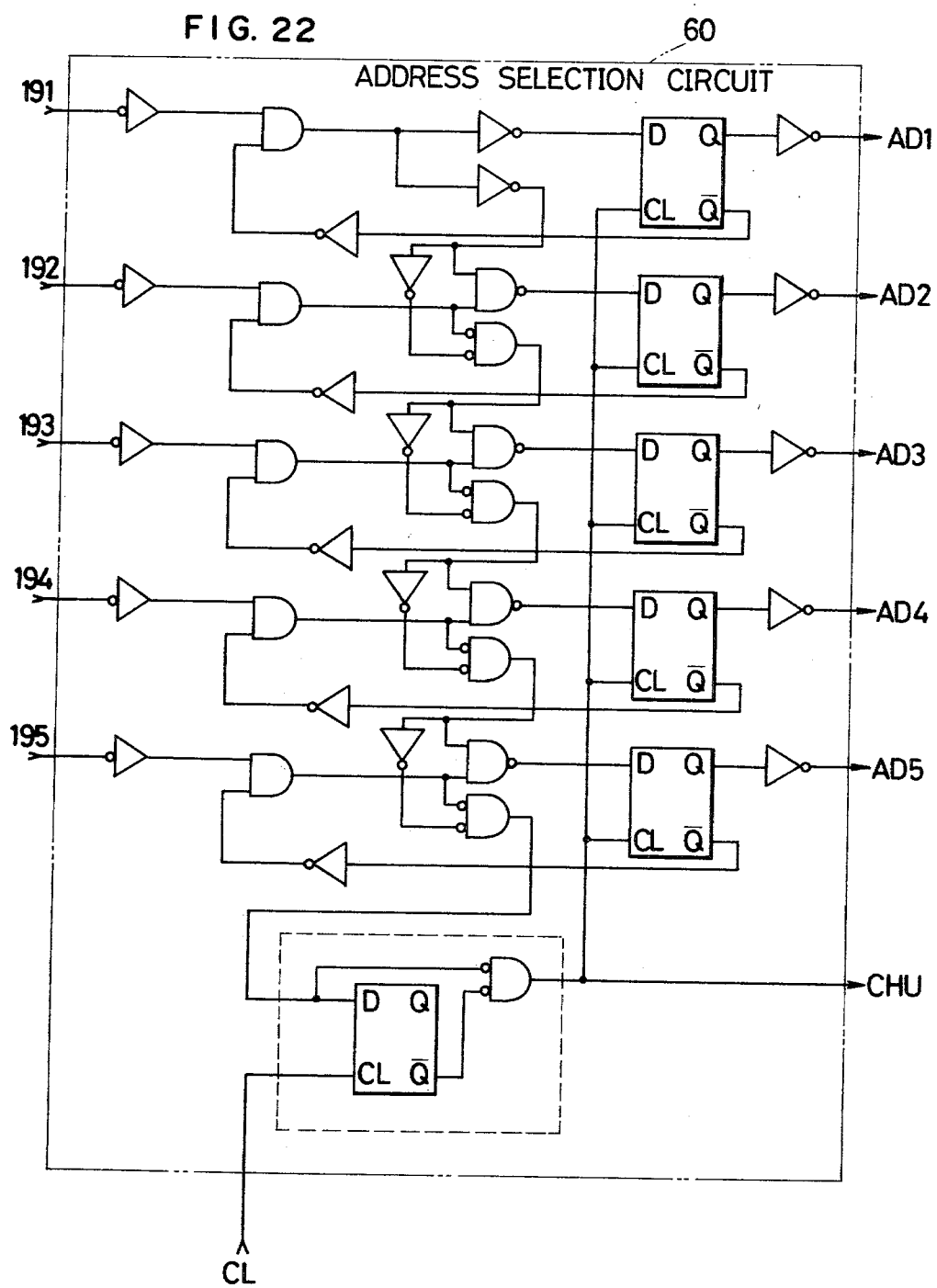
FIG. 22 is a diagram showing in more detail the address selection circuit shown in FIG. 21.

FIG. 22 is a diagram showing in more detail the address selection circuit shown in FIG. 21. Responsive to the depression or operation signals obtained from the respective switches 191 to 195 of the channel selection switch group 19, the corresponding address signals AD1 to AD5 are obtained. Any of the channel selection switches 191 to 195 is operated, the signal CHU is obtained responsive to the clock CL (for example, the high repetition frequency rate clock pulse CL1).

FIG. 23 is a diagram showing in more detail the memory 70 and the data multiplexer gate 71 shown in FIG. 21, wherein only one circuit portion representing the others is depicted in detail, while the other portions of the same circuit configuration are shown merely by dotted lines in a simplified manner.

Figure 24B:
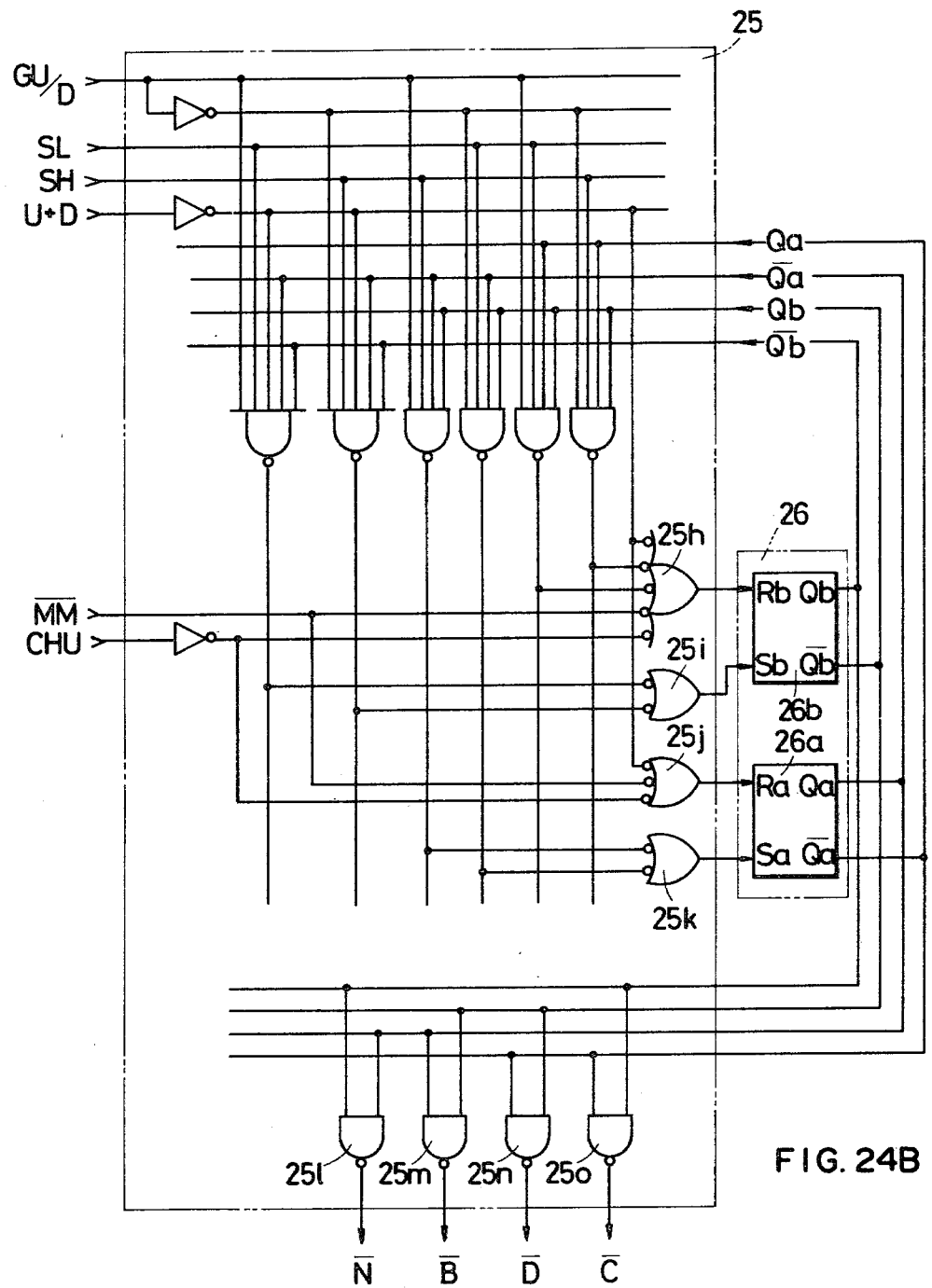
Figure 24C:
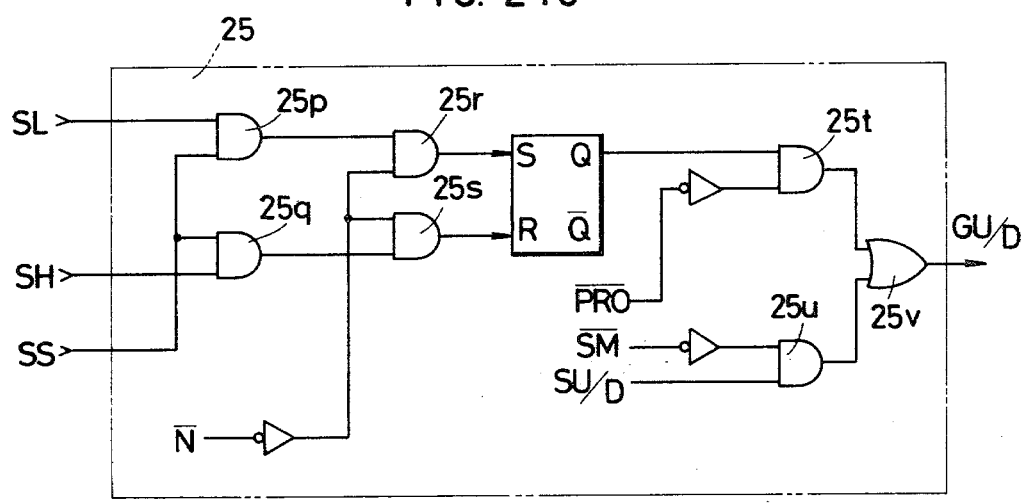

FIGS. 24A, 24B and 24C are diagrams showing in more detail the mode sequence control circuit 25 shown in FIG. 21. With reference to FIGS. 24A, 24B and 24C, the mode sequence control circuit 25 and the mode sequence flip-flip 26 associated therewith will be described in the following. However, it is pointed out that the mode sequence control circuit 25 and the mode sequence flip-flop 26 to be described in the following and the gate control circuit 27 to be described in more detail subsequently are adapted to be shared with the control circuit for the previously described digital automatic scanning tuner and therefore these have been designed such that the same may be used even in such automatic scanning mode. However, these will be described in the following with particular emphasis on the portion that functions as a digital preset tuner.

The mode sequence control circuit 25 is connected to receive the operation signal $\overline{MANU}$ obtained from the manual switch 12m included in the operation switch 12, as shown in FIG. 24A. The mode sequence control circuit 25 is also connected to receive the signal U+D obtained from the NOR gate 125 (FIG. 4) included in the above described switch 12, for the purpose of performing the scanning operation. The mode sequence control circuit 25 is further supplied with the channel selection signal CHU obtained from the address selection circuit 60 shown in FIGS. 21 and 22. These input signals are processed by any suitable gates, thereby to provide the outputs from the OR gates 25a, 25b, 25c and 25d. The output of the OR gate 25a is applied to the set input S1 of the flip-flop 261 included in the mode sequence flip-flop 26 and the output of the OR gate 25b is applied to the reset input R1 of the flip-flop 261. The output of the OR gate 25c is applied to the set input S2 of the flip-flop 262 included in the same circuit 26 and the output of the OR gate 25d is applied to the reset input R2 of the flip-flop 262. The outputs of these flip-flops 261 and 262 are applied to three NAND gates 25e, 25f and 25g. Thus, the signal $\overline{MM}$ is obtained from the NAND gate 25e and the manual operation mode is set with the above described signal $\overline{MM}$ assumes the logic zero. The signal $\overline{SM}$ is obtained from the NAND gate 25f and the scanning operation mode is set when the above described signal $\overline{SM}$ assumes the logic zero. The signal $\overline{PRO}$ is obtained from the NAND gate 25g and the tuning operation in the preset operation mode is set when the above described signal $\overline{PRO}$ assumes the logic zero.

As seen from FIG. 24B, the mode sequence control circuit 25 is further connected to receive the signal GU/D obtained from the circuit 25 (FIG. 24C) to be described subsequently and the signals SL and SH obtained from the wind comparator 21 shown in detail in FIG. 7. The circuit 25 is further connected to receive the respective outputs Qa and Qb and the inverted outputs $\overline{Qa}$ and $\overline{Qb}$ from other flip-flops 26a and 27b included in the mode sequence flip-flop 26. These signals are suitably gated together with the above described signal U+D and are applied to the inverted inputs of the OR gates 25h, 25i, 25j and 25k together with the signals $\overline{MM}$ and CHU. The output of the OR gate 25h is applied to the reset input Rb of the flip-flop 26b and the output of the OR gate 25i is applied to the set input Sb of the flip-flop 26b. The output of the OR gate 25j is applied to the reset input Ra of the flip-flop 26a and the output of the OR gate 25k is applied to the set input Sa of the flip-flop 26a. The outputs of these flip-flops 26a and 26b are applied to the circuit 25 as the input signals thereto and are also applied to four NAND gates 25l, 25m, 25n and 25o. Thus, the signal $\overline{N}$ is obtained from the NAND gate 25l and the signal $\overline{B}$ is obtained from the NAND gate 25m. The signal $\overline{D}$ is is obtained from the NAND gate 25n and the signal $\overline{C}$ is obtained from the NAND gate 25o. It is pointed out that the signals $\overline{N}$, $\overline{B}$, $\overline{D}$ and $\overline{C}$ correspond to the outputs of the AND gates 304a, 304b, 304c and 304d, respectively, included in the count speed selection circuit 30 of the automatic scanning tuner shown in FIG. 11.

As shown in FIG. 24C, the mode sequence control circuit 25 is further connected to receive the signal SS obtained from the gate control circuit 27 to be described subsequently. The signal SS is applied to one input of each of the AND gates 25p and 25q. The signals SL and SH are applied to the other input of each of these AND gates 25p and 25q, respectively. The output of the AND gate 25p is applied to one input of the AND gate 25r and the output of the AND gate 25q is applied to one input of the AND gate 25s. The AND gates 25r and 25s are connected to receive at the respective other inputs thereto an inversion of the signal $\overline{N}$ obtained from the above described NAND gate 25l. The output of the AND gate 25r is applied to the set input S of the flip-flop 251 and the output of the AND gate 25s is applied to the reset input R of the flip-flop 251. The output Q of the flip-flop 251 is applied to one input of the AND gate 25t and an inversion of the signal $\overline{PRO}$ obtained from the above described NAND gate 25g is applied to the other input of the AND gate 25t. Although the AND gate 25u is used for the scanning mode, the said AND gate 25u is connected to receive an inversion of the signal $\overline{SM}$ obtained from the above described NAND gate 25f and the signal SU/D (the output of the flip-flop 126 shown in FIG. 4). The outputs of these two AND gates 25t and 25u are withdrawn through the OR gate 25v as the signal GU/D from the circuit 25. The signal GU/D is used as a signal representing which of the signals SL or SH is detected on the occassion of the zigzag scanning operation, as will be better understood from the description of the operation to be made subsequently.

Figure 25B:
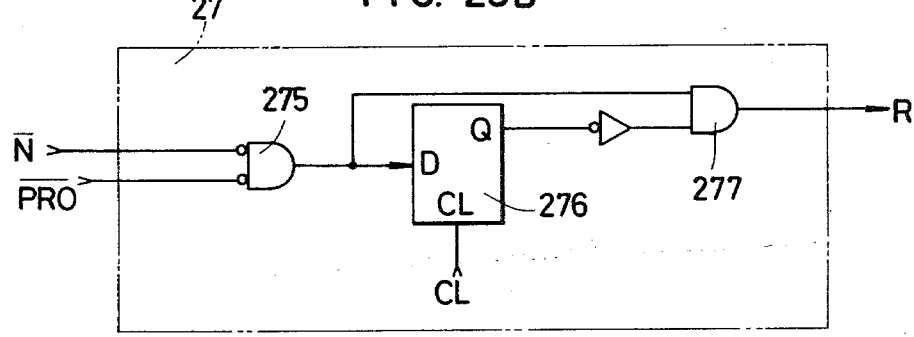
FIG. 25A and 25B show waveforms of electrical signals for explaining the operation of the FIG. 21 embodiment.
Figure 25A:
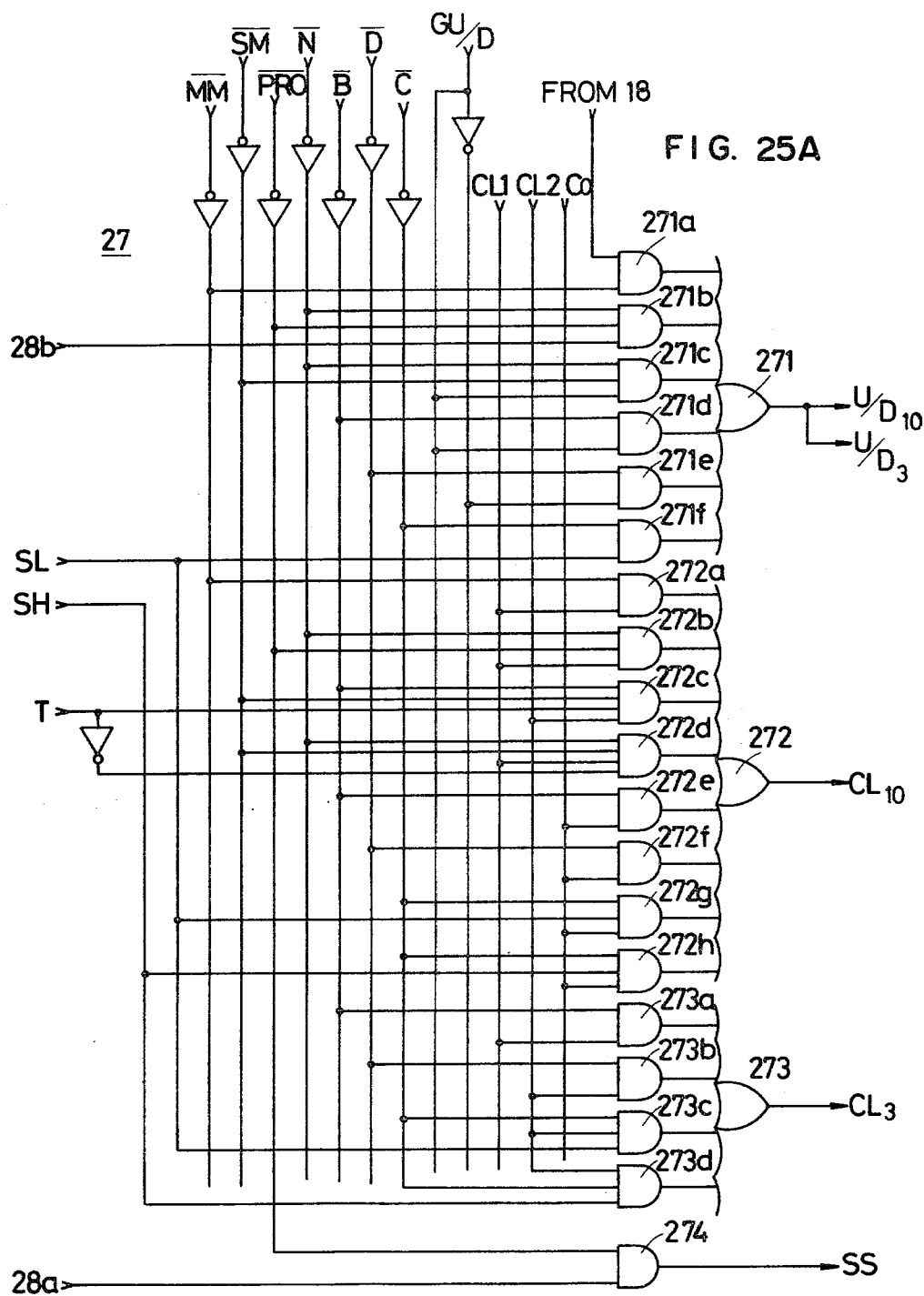

FIGS. 25A and 25B are diagrams showing in detail the gate control circuit. The gate control circuit 27 corresponds to the count speed circuit 30 (FIG. 11) described in conjunction with the previously described embodiment and comprises some components for performing the automatic scanning function; however, description will be made in the following with some emphasis on the components related with the preset tuner.

With reference to FIG. 25A, the gate control circuit 27 is connected to receive the above described signals $\overline{MM}$, $\overline{SM}$, $\overline{PRO}$, $\overline{N}$, $\overline{B}$, $\overline{D}$, $\overline{C}$, GU/D, SL, SH, and T as the input signals thereto. The circuit 27 is further connected to receive the high repetition frequency rate clock pulse CL1, the low repetition frequency rate clock pulse CL2 and the carry signal Co of the three-bit up/down counter 42 included in the counter circuit 40. The circuit 27 is further connected to receive the output signal obtained from the voltage comparator 18 shown in FIGS. 20 and 21 and the signals 28a and 28b obtained from the zigzag scanning control circuit 28 to be described subsequently. These input signals are suitably gate processed, so that the signals $U/D_{10}$ ($U/D_3$), $CL_{10}$, $CL_3$ and SS are obtained from the three OR gates 271, 272 and 273 and the AND gate 274. The signal SS is applied to the mode sequence control circuit 25, as shown in FIG. 22C.

The gate control circuit 27 comprises an AND gate 275 connected to receive an inversion of each of the signals $\overline{PRO}$ and $\overline{N}$. The output of the AND gate 275 is applied to the input D of the D type flip-flop 276 and is also applied to one input of the AND gate 277. The D type flip-flop 276 is connected to receive, as a clock input, the high repetition frequency rate clock pulse CL1 obtained from the high repetition frequency rate clock generator 15 shown in detail in FIG. 5. The output Q of the flip-flop 276 is inverted and the inverted output is applied to the other input of the AND gate 277. The output R of the AND gate 277 is applied to the subsequently described zigzag scanning control circuit 28 as a reset signal and to the above described presettable ten-bit up/down counter 41 as a preset command signal.

Figure 26:
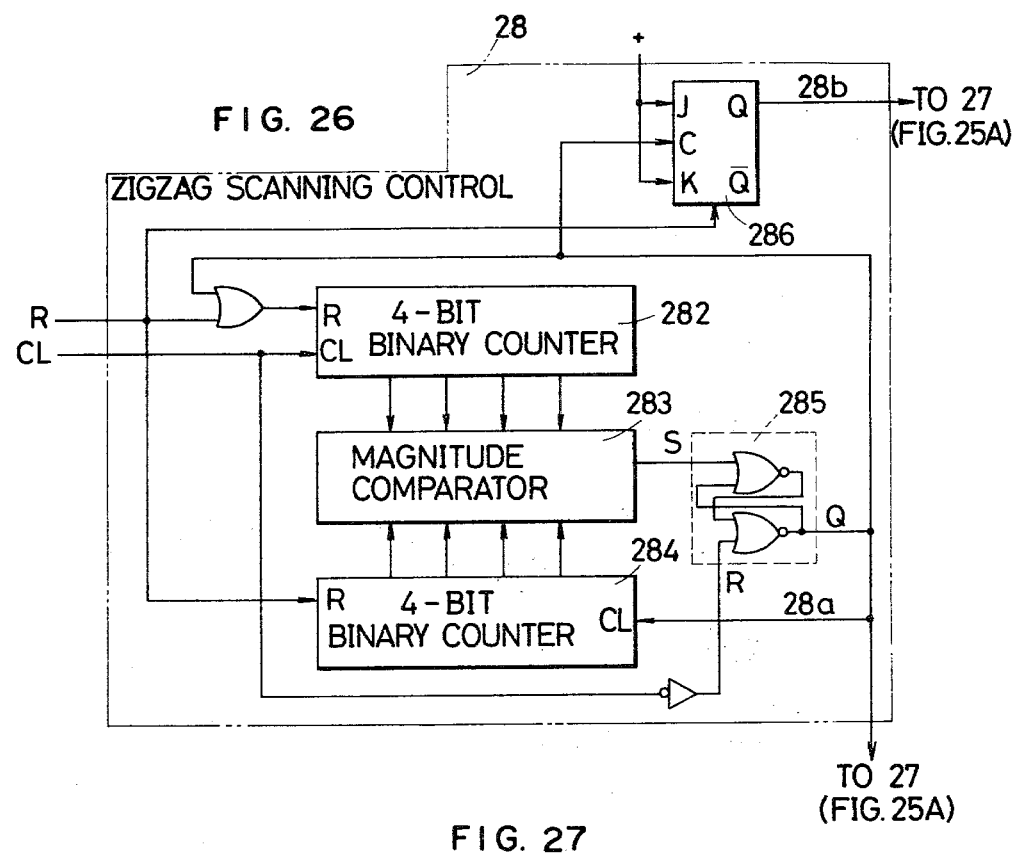
FIG. 26 is a diagram showing in detail the zigzag scanning control circuit shown in FIG. 21.

FIG. 26 is a block diagram showing in detail the zigzag scanning control circuit 28 which constitutes one feature of the embodiment shown. The circuit 28 is included in the above described gate control circuit 27.

The zigzag scanning control circuit 28 shown in FIG. 26 is connected to receive the above described reset signal R and the clock CL such as the high repetition rate clock pulse CL1. The reset signal R is applied to one input of the OR gate 281 and is also applied to the reset input of the four-bit binary counter 284. The output Q obtained from the flip-flop 285 is applied to the other input of the OR gate 281 and the output of the gate 281 is applied to the reset input of another four-bit binary counter 282. The clock pulse CL is applied to the four-bit binary counter 282 as a count input and an inversion thereof is applied to the flip-flop 285 as a reset input R. The output Q of the flip-flop 285 is applied to the four-bit binary counter 284 as a count input and is also applied to the JK flip-flop 286 as a clock input C. The above described reset signal R is applied to the set input S of the JK flip-flop 286. The inputs J and K of the flip-flop 286 are connected to the voltage source, for example, so that normally the same assume the logic one. As a result, the said JK flip-flop 286 functions as a toggle type flip-flop. The outputs A (A0, A1, A2 and A3) and B (B0, B1, B2 and B3) of the above described two four-bit binary counters 282 and 284 are applied in a bit parallel fashion to the four-bit magnitude comparator 283. The four-bit magnitude comparator 283 serves to compare the data A and B thus inputted, thereby to provide the output of the logic one if and when the data A is larger than the data B, which output is applied to the set input R of the above described flip-flop 285.

Figure 27:
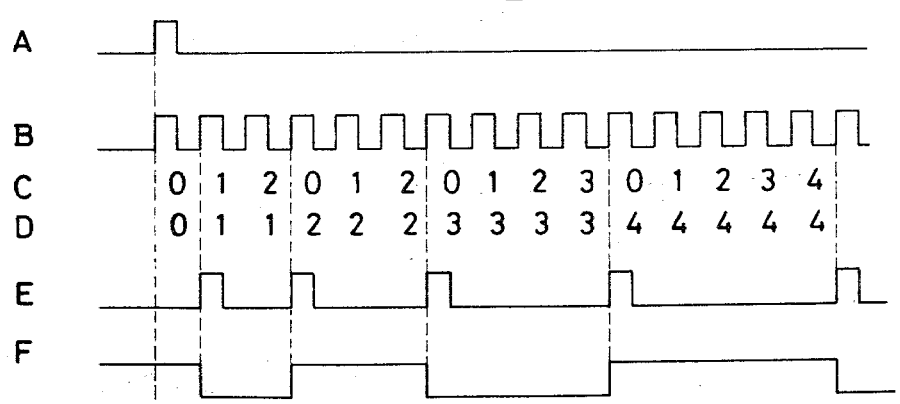
FIG. 27 is a flow diagram showing a sequence of the operation of the embodiment shown in FIGS. 20 and 21.

FIG. 27 shows waveforms of electrical signals for explaining the operation of the zigzag scanning control circuit 28 shown in FIG. 26. In operation, if and when the reset signal R as shown in FIG. 27A is received, both counters 282 and 284 are reset, whereby the data A and B contained therein becomes zero, as shown in FIG. 27C and D. When the clock pulse as shown in FIG. 27B is then applied, the data B in one four-bit binary counter 284 becomes the numerical value "1", while the other four-bit binary counter 282 maintains the numerical value "0". Accordingly, the output Q of the flip-flop 285 becomes the logical one, as shown in FIG. 27E, at that time and the output Q of the JK flip-flop 286, i.e. the signal 28b becomes the logic zero. If and when the third clock pulse is received, the data A and B in both counters 282 and 284 becomes the numerical value "1". If and when a further clock pulse is received, the counter 282 is reset, while the counter 284 makes a further count, whereby the data B therein comes to represent the numerical value "2". Accordingly, even at this time point the output Q of the flip-flop 285, i.e. the signal 28a becomes the logic one and is applied to the JK flip-flop 286. Accordingly, the storing state of the JK flip-flop 286 is reversed and the output Q thereof, i.e. the signal 28b becomes the logic one. Thus, the signal 28b is obtained from the flip-flop 286. The signal 28b is applied to the gate control circuit 27, as described preveiously and shown in FIG. 25A. The output Q of the flip-flop 285, i.e. the signal 28 a is also applied to the circuit 27.

Now that the structural features of the digital preset tuner were described in the foregoing, the operation therof will be described in the following.

At the outset, the preset operation of the above described digital preset tuner will be described. The preset operation may be defined as an operation for storing the digital data corresponding to the channels or the broadcasting stations into the random access memory 70 of ten bits ×five words, as shown in FIGS. 20, 21 and 23. This is the same operation as that of the conventional digital preset tuner. Therefore, now the preset operation will be briefly described in the following. For the purpose of the preset operation, first the power supply, not shown, of the radio receiver 1 is turned on and the manual switch 12m included in the operation switch 12 is manually operated. Accordingly, the signal $\overline{MANU}$ is obtained from the switch 12m, which is applied to the mode sequence control circuit 25 (FIG. 24A). Therefore, the outputs of the logic one are obtained from the OR gates 25b and 25d of the mode sequence control circuit 25 and the flip-flops 261 and 262 are reset, respectively, whereby the output signal $\overline{MM}$ obtained from the NAND gate 25e becomes the logic zero. Accordingly, the mode selection switch 16 is turned to the contact 16m. Therefore, it follows that the variable resistor 17 is connected to the high frequency amplifier 3 and the local oscillator 5 of the FM radio receiver 1, so that these circuits 3 and 5 are placed under control of the direct current voltage obtained from the variable resistor 17, i.e. the tuning voltage. The said voltage is also applied to the minus input of the voltage comparator 18. On the other hand, the plus input of the voltage comparator 18 is supplied with the output voltage obtained from the digital/analog converter 50. Let it be assumed that at the beginning of the preset operation the data in the presettable ten-bit up/down counter 41 included in the count circuit 40, i.e. the voltage obtained from the ten-bit ladder circuit 51 included in the digital-/analog converter 50 is smaller than the direct current voltage obtained from the variable resistor 17. Then the signals $U/D_{10}$ and $U/D_3$ are obtained as the logic one from the AND gate 271a of the gate control circuit 27 and thus from the OR gate 271 shown in FIG. 25A, whereby the ten-bit up/down counter 41 and the three-bit up/down counter 42 included in the count circuit 40 both are placed in the up count mode. At the time, the high repetition frequency rate clock pulse CL1 is obtained as a count input of the ten-bit up/down counter 41 from the AND gate 272a and thus from the OR gate 272 of the circuit 27. Accordingly, the ten-bit up/down counter 41 makes an up count operation.

Adjustment of the variable resistor 17 causes the voltage applied to the FM receiver 1 and the voltage comparator 18 to be varied. Thus, the presettable ten-bit up/down counter 41 makes an up count operation accordingly, as described previously. If and when two input voltages applied to the voltage comparator 18 become equal to each other, the output of the logic zero is obtained therefrom. Therefore, adjustment of the variable resistor 17 is terminated at a complete tuning point to a desired broadcasting station, whereupon the presettable ten-bit up/down counter 41 makes a count operation accordingly. If and when the output of the voltage comparator 18 becomes the logic zero, the signal $U/D_{10}(U/D_3)$ obtained from the OR gate 271 of the gate control circuit 27 becomes the logic zero. Accordingly, the presettable ten-bit up/down counter 41 starts a down count operation responsive to the high repetition frequency rate clock pulse CL1. Since the voltage of the variable resistor 17 and the voltage obtained from the digital/analog converter 50 are substantially the same in that situation, the output of the voltage comparator 18 then turns to the logic one. Accordingly, again the ten-bit up/down counter 41 starts an up count operation. Thus, the presettable ten-bit up/down counter 41 repeats an up count or a down count within the range of a complete tuning point as preset by the variable resistor 17. Such a state may be referred to as a preset write stand-by state.

The write operation of the preset data in the memory 70 is performed by operating the write switch 12w included in the operation switch 12 and by operating any one of the channel selection switches included in the channel selection switch group 19. More specifically, when the broadcasting station tuned in the above described manner is to be preset in any one of channels, such as a channel corresponding to the channel selection switch 191, the channel selection switch 191 is turned on. Accordingly, the address selection circuit 60 designates the address AD1 of the memory 70 corresponding to the channel selection switch 191. At the same time, the signal CHU is applied to the mode sequence control circuit. When the write switch 12w is turned on, a signal is obtained from the differentiation circuit 29, which is applied to the data multiplexer gate 71 as a write command signal. Accordingly, the data in the presettable ten-bit up/down counter 41 is written in the address AD1 previously selected as a function of the above described write command signal. Thus, various digital data concerning the corresponding channels is stored in all addresses or in a desired number of addresses of the memory 70.

Now the station selecting operation of the preset operation mode will be described in the following. The station selecting operation is aimed to read out the digital data stored in the memory 70 to control the FM receiver 1 so as to receive the channel corresponding to the read digital data and constitutes one essential feature of the embodiment shown.

Figure 28:
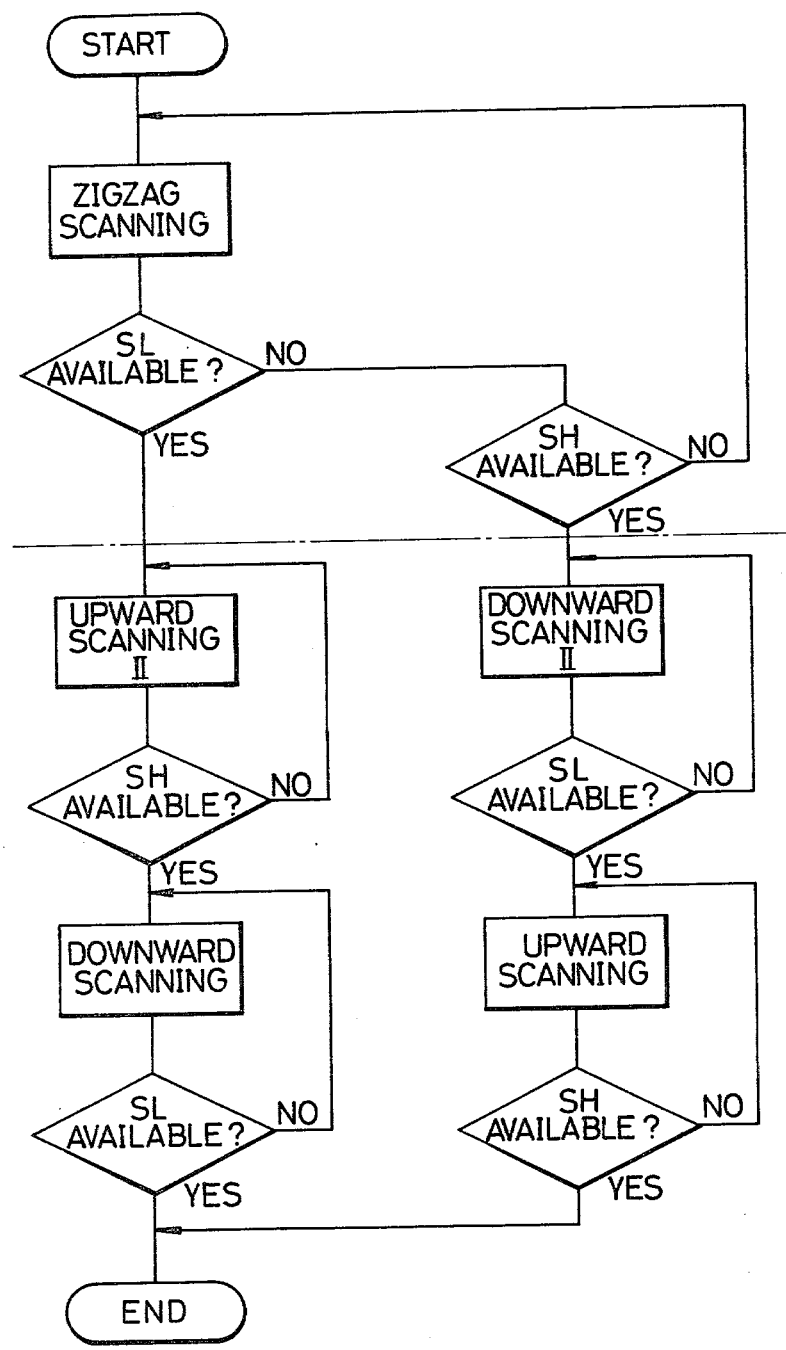
FIG. 28 is a timing chart for specifically explaining the zigzag scanning state.
Figure 29:
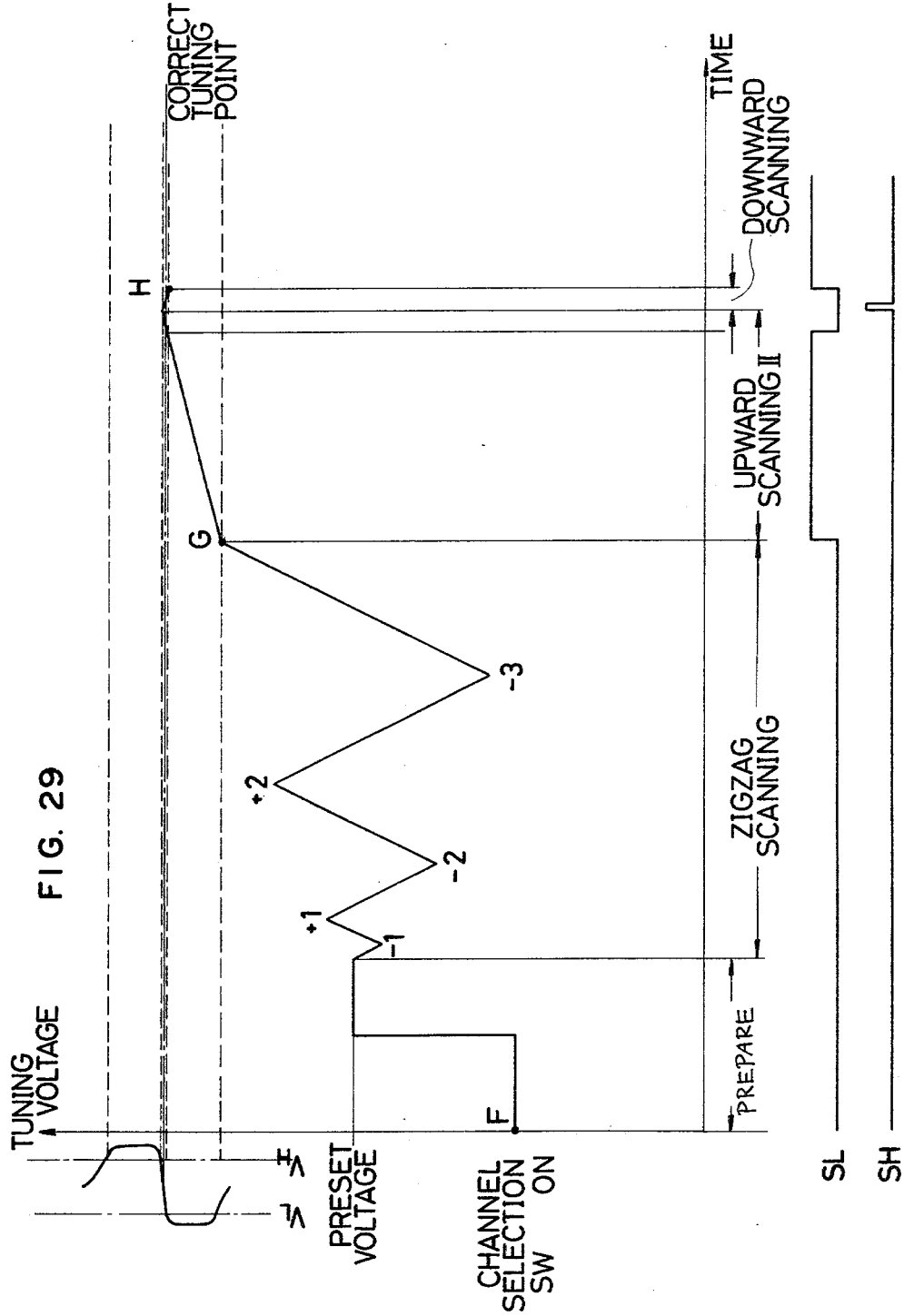

FIG. 28 is a flow diagram showing an operation sequence of the preset station selecting operation in accordance with the embodiment shown, and FIG. 29 is a timing chart for explaining the operation sequence. Now description will be made of the preset station selecting operation in accordance with the embodiment shown with reference to FIGS. 28 and 29.

The preset station selecting operation basically comprises three operation states, i.e. a preparatory operation, a zigzag scanning operation, and a tuning operation. The preparatory operation is initiated by turning on any one of the selection switches of the channel selection switch group 19 shown in FIGS. 20 and 21. Let it be assumed that the said one of the channel selection switches is operated at the point F of FIG. 29. When any one of the channel selection switches is operated, the signal CHU is obtained from the address selection circuit 60. Accordingly, the outputs are obtained from the OR gates 25h and 25j shown in FIG. 24B and the flip-flops 26b and 26a are both reset. Accordingly, the signal $\overline{N}$ is obtained from the NAND gate 25 as the logic zero.

When the signal $\overline{N}$ is obtained, the reset signal R is obtained at the timing of the high repetition frequency rate clock pulse CL1 from the AND gate 277 of the gate control circuit 27 shown in FIG. 25B. As previously described, the reset signal R is applied to the counter of the zigzag scanning control circuit 28 as a reset input and is also applied to the presettable ten-bit up/down counter 41 as a preset command signal. Accordingly, the presettable ten-bit up/down counter 41 is responsive to the signal R to preset the data obtained from the address of the memory 70 corresponding to the channel selection switch, as selected. Thus, the analog voltage associated with the data is obtained from the ten-bit ladder circuit 51 of the digital/analog converter 50 based on the data as preset in the ten-bit up/down counter 41. Since the analog switch 16 has been turned to the contact 16 p responsive to the previously described signal $\overline{PRO}$, the above described analog voltage is applied through the switch 16 to the high frequency amplifier 3 and the local oscillator 5 as a tuning voltage.

Accordingly, the FM receiver 1 establishes a reception state for the channel corresponding to the digital data stored in advance in the memory 70. It can be considered that such reception state could assume any one of a complete tuning state, an incomplete tuning state and a detuning state; however, the zigzag scanning operation to be described subsequently is started, whichever reception state had been established. Such a preparatory operation may be preset for a predetermined time period, say 48 m sec, for the purpose of complete setting of the preset data in the ten-bit up/down counter 41. The above described setting of a predetermined time period for the preparatory operation can be performed by delaying in an analog manner or a digital manner the timing of the signal $\overline{N}$ until the timing when the signal SS is obtained from the AND gate 274 shown in FIG. 25A.

Now a description will be made of the zigzag scanning operation which constitutes one essential feature of the embodiment shown. Briefly described, the zigzag scanning operation is aimed to swing the tuning voltage upward or downward, assuming that the analog voltage corresponding to the digital data stored in the memory 70 is a tuning voltage, thereby to achieve a tuning state to a desired channel, even when the reception state is an incomplete tuning state or a detuning state.

If and when the signal N is obtained and the signal R is obtained from the circuit 27 as described previously, the zigzag scanning control circuit 28 shown in FIG. 26 starts an operation, so that the signal 28a is obtained as shown in FIG. 27E. Accordingly, at that timing the signal SS is obtained from the AND gate 274 shown in FIG. 25A. The AND gates 25p and 25q of the mode sequence control circuit shown in FIG. 24C are opened responsive to the signal SS. Now let it be assumed that the receiver is in a detuning state as shown in FIG. 29. When the zigzag scanning control circuit 28 is enabled as described previously, the signal 28b is thereafter obtained from the circuit 28 as shown in FIG. 27F. At the outset, the above described signal 28b assumes the logic zero. Accordingly, the output from the AND gate 271b shown in FIG. 25a assumes the logic zero and accordingly the output signal U/D$_{10}$ (U/D$_3$) obtained from the OR gate 271 also assumes the logic zero. At that time, the high repetition frequency rate clock pulse CL1 is obtained from the AND gate 272b and thus OR gate 272 of the circuit 27 as a clock pulse of the ten-bit up/down counter 41. Accordingly, the presettable ten-bit up/down counter 41 makes a down count operation responsive to the high repetition frequency rate clock pulse CL1 for the first period of the logic zero of the signal 28b shown in FIG. 27F. Therefore, the tuning voltage applied to the receiver 1 gradually decreases from the preset voltage as shown in FIG. 29. Thereafter the signal 28a is obtained as shown in FIG. 27E and the signal SS is obtained from the gate control circuit 27. Accordingly, the AND gate 25p (25q) is again opened at the timing of the signal SS. This is denoted as a decision step of "signal SL available?" or "signal SH available?" in the FIG. 28 flow diagram. As seen from FIG. 29, the state of the receiver is far from a correct tuning point. Therefore, the signal 28b is then obtained as the logic one from the zigzag scanning control circuit 28 as shown in FIG. 27F. This logic one period has been directed to be longer than the previously described logic zero. During that logic one period the signal U/D$_{10}$ obtained from the OR gate 271 of the gate control circuit 27 assumes the logic one. Even at that time the high repetition frequency rate clock pulse CL1 is obtained and the OR gate 272 as the signal CL$_{10}$. Accordingly, the ten-bet up/down counter 41 makes an up count operation during the time period when the above described signal 28b assumes the logic one. Such state is further shown in FIG. 29. Thus, the presettable ten-bit counter 41 repeats an up count operation or a down count operation, while the tuning voltage is swung upward or downward, whereupon decision is in succession made as to whether the signal SL or SH is available at the timing of the signal SS, i.e. as to whether the S shaped curve is caught with respect to a desired broadcasting station. If neither the signal SL nor SH is available, the swing operation of the tuning voltage or the so-called zigzag scanning operation is continued as shown in FIG. 29.

If and when the signal SL is detected at the point G shown in FIG. 29 in the course of the above described zigzag scanning operation, then the logic one output is obtained from the AND gate 25p shown in FIG. 24C at the timing of the signal SS, whereby the flip-flop 201 is set. Therefore, the signal GU/D obtained from the AND gate 25t, i.e. the OR gate 25v of the circuit 25 becomes the logic one. Thus, the signal GU/D becomes the logic one if and when the signal SL is detected while the up/down counter 41 makes an up count operation in the course of the zigzag scanning operation, whereas the signal GU/D assumes the logic zero if and when the signal SH is detected while the up/down counter 41 makes a down count operation. The output is obtained from the OR gate 25a shown in FIG. 24B responsive to the logic one of the signal GU/D, whereby the flip-flop 26b is set, so that the output Qb thereof becomes the logic one. Accordingly, the output signal B of the NAND gate 25m included in the circuit 25 becomes the logic zero. Accordingly, the apparatus is released from the above described zigzag scanning operation to shit to an upward scanning operation described in conjunction with the previously described automatic scanning tuner.

When the signal $\overline{B}$ is obtained and the mode is shifted as described previously, thereafter the same operation as the previously described automatic scanning tuner is performed. Accordingly, the signals U/D$_{10}$ and U/D$_3$ are obtained as the logic one from the AND gate 271d and thus from the OR gate 271 of the gate control circuit 27 (FIG. 25A). At that time the carry signal Co obtained from the three-bit up/down counter 42 is applied from the AND gate 272e and thus the OR gate 272 of the circuit 27 to the ten-bit up down counter 41 as a clock CL$_{10}$. On the other hand, at that time the high repetition frequency rate clock pulse CL1 is applied from the AND gate 273a and thus from the OR gate 273 of the gate control circuit 27 to the three-bit up/down counter 42 as a count clock CL$_3$. Accordingly, the three-bit up/down counter 42 makes a step operation responsive to the high repetition frequency rate clock pulse CL1 and one carry signal Co is obtained for every eight count. Therefore, the ten-bit up/down counter 41 makes one up count each time eight high repetition frequency rate clock pulses CL1 are obtained. In other words, in the upward scanning operation mode II after the signal SL is thus detected, the operation becomes as slow as one eighth the speed of the above described high speed scanning operation. Thus, the upward scanning operation mode II is initiated from that time as shown in the FIG. 29 timing chart, whereby the tuning frequency by the receiver 1 varies in the upward direction at the low speed.

The above described low speed scanning operation, i.e. the upward scanning operation mode II is continued, while the signal SH of the logic one as shown in FIG. 8C is continually obtained from the wind comparator 21 shown in FIG. 7. Accordingly, the output of the OR gate 25k is obtained as the logic one from the mode sequence control circuit 25 (FIGS. 24A, 24B and 24C) included in the control circuit 20. Accordingly, the subsequent stage flip-flop 26a is set and the output Qa of the flip-flop 26a becomes the logic one. More specifically, two flip-flops 26a and 26b both are set at that time, whereby the outputs Qa and Qb both becomes the logic one. The outputs Qa and Qb of the logic one are applied to the NAND gate 25n, whereby the signal $\overline{D}$ is obtained. The above described signal D is applied to the gate control circuit 27. Accordingly, the signals $u/D_{10}$ and $U/D_3$ obtained from the OR gate 271 included in the circuit 27 both becomes the logic zero. Accordingly, the presettable ten-bit up/down counter 41 and the three-bit up/down counter 42 included in the counter circuit 40 are both placed in a down count operation mode. On the other hand, the clock pulse obtained from the low repetition frequency rate clock generator 14 is obtained as a clock $CL_3$ being applied to the three-bit up/down counter 42 from the AND gate 273b and thus the OR gate 273 of the gate control circuit 27. Accordingly, the three-bit up/down counter 42 makes a down count operation responsive to the low repetition frequency rate clock pulse CL2 and a carry signal Co is obtained for each count of eight low repetition frequency rate clock pulses CL2. Therefore, the carry signal Co obtained from the three-bit up/down counter 42 is applied from the AND gate 272f and thus from the OR gate 272 of the gate control circuit 27 to the ten-bit up/down counter 41 as the clock $CL_{10}$. Since the signal $\overline{D}$ is the logic zero at that time, the output is obtained from the AND gate 522b of the three-bit pulse width modulation circuit 52 shown in FIG. 13. The analog voltage obtained from the three-bit pulse width modulation circuit 52 is added to the output of the ten-bit ladder circuit 51, thereby to provide the output as a tuning voltage. More specifically, when the signal L is detected, which is followed by detection of the signal SH, the scanning direction is changed to the downward direction just when the three-bit pulse width modulation circuit 52 is operated. Thereafter, the downward scanning operation of the resolution thus enhanced is continued and then the signal SL is obtained from the wind comparator 21 included in the control circuit 20, as seen from the FIG. 29 timing chart.

When the signal SL is obtained as described previously, the output of the OR gate 25h of the mode sequence control circuit 25 shown in FIG. 24b is obtained as the logic one. Accordingly, the corresponding flip-flop 26b is reset and the output Qb thereof becomes the logic zero. Accordingly, the output signal $\overline{C}$ of the NAND gate 250 becomes the logic zero. Therefore, the signal obtaind from the OR gate 271 of the gate control circuit 27 shown in FIG. 25A remains the logic zero, while neither the clock pulse $CL_{10}$ nor $CL_3$ is obtained from any of the OR gates 272 and 273, with the result that the counter circuit 40 maintains the established state. Accordingly, the voltage obtained from the digital/analog converter 50 also maintains the established voltage, with the result that the tuning point of the high frequency amplifier 3 and the local oscillator 5 of the receiver 1 maintains the point H shown in FIG. 29. In other words, the very point H represents a correct tuning point.

It is pointed out that the operation after the downward scanning operation mode II is substantially the same as the automatic scanning operation in the upward direction described previously, except that the direction is reversed.

It is pointed out that in either case of the digital automatic scanning tuner and the digital preset tuner the signals SL and SH in terms of the S letter shaped curve are determined based on the threshold level of the wind comparator 21 and the amplification degree of the amplifier 112 of the S letter shaped curve detecting circuit 11. Accordingly, any suitable selection of these factors enables detection of the signal of a desired electric field intensity considering a preset tuner, in case where the digital data stored in advance in the memory 70 resides in a complete tuning point of the corresponding channel, then the signal SL or SH is detected in the course of the previously described zigzag scanning operation, with the result that the zigzag scanning operation is immediately stopped. On the other hand, in case where the digital data as preset resides in a totally detuned point with respect to the corresponding channel, the signal SL or SH is immediately obtained in the preparatory operation, with the result that the zigzag scanning operation is immediately shifted to the tuning operation.

Considering again the above described preset tuner, some restriction in terms of time is required to the zigzag scanning operation as a matter of course. More specifically, in case of a signal of weak electric field intensity or improper data stored in the memory, proper reception state cannot be established and therefore a predetermined time restriction is required to avoid such situation. Accordingly, in a preferred embodiment of the above described preset tuner, in case where neither the signal SL nor SH is detected after several-time repetition of swing of the tuning voltage, i.e. neither the signal SL nor SH is detected within a predetermined time period, the data in the presettable ten-bit up/down counter 41 is returned to the value of the digital data stored in advance in the memory 70, whereupon the count operation is terminated. Such control can be performed in the following manner. More specifically, the apparatus is structured such that a carry signal is obtained from the counter 284 of the zigzag scanning control circuit 28 and the preset data obtained from the memory 70 is applied to the presettable counter 41 responsive to the above described carry signal, while the preset signal is applied to the counter 41, whereby the counter 41 is again preset. At the same time, the preset is obtained from the OR gates 25h and 25k, so that the signal $\overline{C}$ from the NAND gate 250 is obtained at the circuit 25 (FIG. 24B). If and when neither the signal SH nor SL is detected within a predetermined time period after either the signal SL or SH is detected, the apparatus is controlled in the same manner.

If and when the correct tuning point is attained, the digital signal in the ten-bit up/down counter 41 is compensated by means of the three-bit down/counter 42, whereby the optimum reception state is maintained. Such compensating operation is fully described in U.S. Patent application Ser. No. 870,670, filed Jan. 18, 1978 and assigned to the same assignee as the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A tuning control apparatus for a digital tuner for selection of a high frequency signal through variation of a reactance value formed across a voltage controlled variable reactance device responsive to a tuning control signal, comprising, high frequency signal receiving means for receiving a high frequency signal, local oscillating means for generating a local oscillation frequency signal the frequency of which is different by a given frequency difference from that of said high frequency signal, mixing means responsive to said high frequency signal receiving means and said local oscillating means for mixing said high frequency signal with said local oscillation frequency signal for providing an intermediate frequency signal, intermediate frequency signal amplifying means responsive to said mixing means for amplifying said intermediate frequency signal, said local oscillating means comprising, as a tuning circuit component, a voltage controlled variable reactance device so as to be responsive to a tuning control voltage, whereby a reactance value formed thereacross is variable as a function of the tuning control voltage and thus said local oscillation frequency is variable as a function of the tuning control voltage, digital data generating means for generatig digital data associated with the frequency of said high frequency signal received by said high frequency receiving means, digital/analog converting means for converting said digital data obtained from said digital data generating means into an analog voltage associated with said digital data, said analog voltage obtained from said digital/analog converting means being applied to said voltage controlled variable reactance device as said tuning voltage, tuning state detecting means responsive to said intermediate frequency amplifying means for generating a first signal when the tuning frequency of said digital tuner resides in a predetermined frequency range lower than a correct tuning frequency of a high frequency signal and generating a second signal when said tuning frequency of said digital tuner resides in a predetermined frequency range higher than said correct tuning frequency, and, digital data generation control means responsive to said tuning state detecting means for controlling said digital data generating means for controlling said tuning voltage, said digital data generation control means comprising first control means responsive to detection of said first or second signal by said tuning state detecting means for controlling said digital data generating means for subsequent detection of said second or first signal by said tuning state detecting means, second control means responsive to detection of said or first signal by said tuning state detecting means for controlling said digital data generating means for further detection of said first or second signal by said tuning state detecting means, and third control means responsive to further detection of said first or second signal by said tuning state detecting means for controlling said digital data generating means for maintaining said tuning voltage in substantially a constant value.

2. A tuning control apparatus for a digital tuner in accordance with claim 1, wherein said tuning state detecting means comprises a frequency detector connected to receive said intermediate frequency signal from said intermediate frequency signal amplifying means.

3. A tuning control apparatus for a digital tuner in accordance with claim 2, wherein said tuning state detecting means further comprises two level detecting means for level detecting the output of said frequency detecting means at two different predetermined levels, the output of one level detecting means being withdrawn as said first signal and the output of the other level detecting means being withdrawn as said second signal.

4. A tuning control apparatus for a digital tuner in accordance with claim 1, wherein said digital data generating means comprises means for sequentially varying said digital data, and said digital data generation control means comprises means for controlling said digital data varying means for varying said digital data obtained from said digital data generating means.

5. A tuning control apparatus for a digital tuner in accordance with claim 4, wherein said first and second control means included in said digital data generation control means are adapted to control variation of said digital data at the respective predetermined variation speeds.

6. A tuning control apparatus for a digital tuner in accordance with claim 5, wherein said second control means is adapted to control variation of said digital data obtained from said digital data generating means at substantially the same variation speed at as that by said first control means.

7. A tuning control apparatus for a digital tuner in accordance with claim 4, wherein said second control means is adapted to control the variation rate by said digital data varying means to be smaller than the variation rate under the control by said first control means.

8. A tuning control apparatus for a digital tuner in accordance with claim 1, wherein said digital data generation control means further comprises fourth control means for controlling said digital data generating means for varying said high frequency of said high frequency signal received by said high frequency receiving means until said tuning state detecting means detects either said first signal or second signal, when said tuning state detecting means detects neither said first signal nor said second signal.

9. A tuning control apparatus for a digital tuner in accordance with claim 8, wherein said digital tuner comprises an automatic scanning tuner, and said fourth control means is adapted to control said digital data generating means such that said high frequency of said high frequency signal received by said high frequency receiving means is continually varied in the upward or downward direction.

10. A tuning control apparatus for a digital tuner in accordance with claim 9, wherein said automatic scanning tuner comprises instructing means for instructing an automatic scanning operation, and said fourth control means is adapted to start controlling said digital data generating means responsive to the instructions from said instructing means.

11. A tuning control apparatus for a digital tuner in accordance with claim 10, wherin said fourth control means is adapted to vary at a first speed said digital data generating means during a predetermined time period from the start and thereafter vary said digital data generating means at a second speed that is faster than said first speed.

12. A tuning control apparatus for a digital tuner in accordance with clam 9, wherein said digital tuner comprises a preset tuner, said digital data generating means comprises means for presetting digital data concerning the frequency of a given high frequency signal, and said fourth control means comprises means for controlling said digital data generating means for correcting said digital data as preset.

13. A tuning control apparatus for a digital tuner in accordance with claim 12, wherein said means for controlling said digital data generating means for correcting said digital data as preset comprises means for changing the varying direction of said tuning voltage alternately for varying said tuning voltage in a zigzag manner while the magnitude of the tuning voltage is increased as the varying direction of said tuning voltage is alternately changed in said zigzag manner.

14. A tuning control apparatus for a digital tuner in accordance with claim 1, wherein said digital data generating means comprises clock pulse generating means for generating clock pulses, and an up/down counter for counting said clock pulses, and said digital data generation control means comprises means for controlling generation of said clock pulses being applied to said up/down counter from said clock pulse generating means and the counting direction of said up/down counter.

15. A tuning control apparatus for a digital tuner in accordance with claim 14, wherein said up/down counter comprises a main up/down counter having a relatively large number of bits and an auxiliary up/down counter of a relatively smaller number of bits, said digital/analog converting means comprises a main digital/analog converter for converting the digital data obtained from said main up/down counter into an analog voltage, auxillary digital/analog converter for converting said digital data obtained from said auxiliary up/down counter into an analog voltage, and means for adding the output from said main digital/analog converter and the output from said auxiliary digital/analog converter.

16. A tuning control apparatus for a digital tuner in accordance with claim 15, wherein said clock pulse is applied to said auxiliary up/down counter, and said main up/down counter is adapted to make a count operation responsive to a carry signal of said auxiliary up/down counter.

17. A tuning control apparatus for a digital tuner in accordance with claim 16, wherein said first control means of said digital data generation control means is adapted to make ineffective at least one of the count data of said auxiliary up/down counter and the output of said auxiliary digital/analog converter.

18. A tuning control apparatus for a digital tuner in accordance with claim 14, wherein said digital data generation control means comprises fourth control means for controlling said up/down counter until said tuning state detecting means detects either said first signal or said second signal when said tuning state detecting means detects neither said first signal nor said second signal.

19. A tuning control apparatus for a digital tuner in accordance with claim 18, wherein said digital tuner comprises an automatic scanning tuner, said clock pulse generating means is structured to generate two trains of clock pulses having different repetition frequency rates, said fourth control means is structured such that said up/down counter is initially supplied for a predetermined time period with the clock pulse train the repetition frequency rate of which is relatively smaller, which is thereafter switched to the clock pulse train of a relatively large repetition frequency rate.

20. A tuning control apparatus for a digital tuner in accordance with claim 19, wherein said fourth control means comprises timer means for determining said predetermined time period.

21. A tuning control apparatus for a digital tuner in accordance with claim 14, wherein said digital tuner comprises a preset tuner, said digital data generating means comprises means for generating preset data concerning a frequency being received, said up/down counter comprises a presettable counter which is preloaded with the preset data obtained from said preset data generating means for making thereafter an up count or down count operation responsive to the clock pulses obtained from said clock pulse generating means under the control of said control means.

22. A tuning control apparatus for a digital tuner in accordance with claim 21, wherein said up/down counter comprises a main presettable up/down counter of a relatively large number of bits adapted for presetting said preset data and an auxiliary up/down counter of a relatively small number of bits, said digital/analog converting means comprises a main digital/analog converter for converting said digital data obtained from said main presettable up/down counter to a main analog voltage, an auxiliary digital/analog converter for converting said digital data obtained from said auxiliary up/down counter to an auxiliary analog voltage, and means for adding said main analog voltage output of said main digital/analog converter and the said auxiliary analog voltage output of said auxiliary digital/analog converter.

23. A tuning control apparatus for a digital tuner in accordance with claim 22, wherein said digital data generation control means comprises fourth control means for controlling said digital data generating means for varying said frequency being received until said tuning state detecting means detects either said first signal or said second signal when said tuning state detecting means detects neither said first signal nor said second signal.

24. A tuning control apparatus for a digital tuner in accordance with claim 23, wherein said fourth control means comprises means for controlling said digital data generating means for correcting said digital data preset in said main presettable up/down counter.

25. A tuning control apparatus for a digital tuner in accordance with claim 24, wherein said fourth control means is structured such that said clock pulses are applied to said main up/down counter as preset and the count direction of said main up/down counter is alternately changed as the count time period is in succession prolonged.

26. A tuning control apparatus for a digital tuner in accordance with claim 25, wherein said first control means and said second control means are structured such that said clock pulses are applied to said auxiliary up/down counter and the carry signal of said auxiliary up/down counter is applied to said main presettable up/down counter.

27. A tuning control apparatus for a digital tuner in accordance with claim 26, wherein said first control means is structured such that the count data in said auxiliary up/down counter or the output of said auxiliary digital/analog converter is substantially modified.

* * * * *